United States Patent
Lee et al.

(10) Patent No.: US 11,099,417 B2
(45) Date of Patent: Aug. 24, 2021

(54) ELECTRONIC DISPLAY APPARATUS TO MITIGATE VISIBILITY OF TERMINAL WIRING IN NON-DISPLAY AREA

(71) Applicant: Samsung Display Co., Ltd., Yongin-si (KR)

(72) Inventors: Minsu Lee, Yongin-si (KR); Wonjang Ki, Yongin-si (KR); Dae-Hyun Noh, Hwaseong-si (KR); Yongsung Park, Seoul (KR); Seungbin Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/739,829

(22) Filed: Jan. 10, 2020

(65) Prior Publication Data

US 2020/0271983 A1 Aug. 27, 2020

(30) Foreign Application Priority Data

Feb. 22, 2019 (KR) .................. 10-2019-0021011

(51) Int. Cl.
*G02F 1/1335* (2006.01)
*H01L 33/44* (2010.01)
(Continued)

(52) U.S. Cl.
CPC .......... *G02F 1/133502* (2013.01); *G02B 1/11* (2013.01); *G02F 1/133512* (2013.01);
(Continued)

(58) Field of Classification Search
CPC ......... G02F 1/133502; G02F 1/133514; G02F 1/133512; G02F 2001/1351;
(Continued)

(56) References Cited

U.S. PATENT DOCUMENTS 9,430,180 B2 8/2016 Hirakata et al.
9,436,051 B2 * 9/2016 Park .................. H01J 29/327
(Continued)

FOREIGN PATENT DOCUMENTS

KR 10-2015-0026180 3/2015
KR 10-2016-0082252 7/2016
(Continued)

OTHER PUBLICATIONS

Tuquabo Tesfamichael, Optical Characterization and Modeling of Black Pigments Used in Thickness-Sensitive Solar-Selective Absorbing Paints, Dec. 22, 2000, pp. 35-43, vol. 69, Elsevier Science Ltd, Sweden.

*Primary Examiner* — Laurance J Lee
(74) *Attorney, Agent, or Firm* — H.C. Park & Associates, PLC

(57) ABSTRACT

An electronic apparatus including a base substrate that includes an active area and a peripheral area adjacent to the active area, a plurality of pixels that are disposed in the active area, a plurality of pads that are disposed in the peripheral area, fan-out lines that are disposed in the peripheral area and connect the pixels and the pads, and an anti-reflection layer that includes an active portion and a peripheral portion. The active portion overlaps the active area and includes a plurality of color patterns respectively overlapping the pixels, and the peripheral portion overlaps the peripheral area. The anti-reflection layer overlaps at least a part of the fan-out lines.

20 Claims, 16 Drawing Sheets

(51) Int. Cl.
*G02B 1/11* (2015.01)
*G02F 1/135* (2006.01)

(52) U.S. Cl.
CPC ........ *G02F 1/133514* (2013.01); *H01L 33/44* (2013.01); *G02F 1/1351* (2021.01)

(58) Field of Classification Search
CPC ...... G02F 1/136286; G09G 2300/0426; G06F 3/0412; G02B 1/11; G02B 1/133502
See application file for complete search history.

(56) References Cited

U.S. PATENT DOCUMENTS

| | | | |
|---|---|---|---|
| 9,753,194 B2 | 9/2017 | Lee et al. | |
| 9,804,306 B2 | 10/2017 | Lee et al. | |
| 10,084,025 B2 | 9/2018 | Choi et al. | |
| 2006/0279677 A1* | 12/2006 | Matsushima | G02F 1/133555 349/114 |
| 2015/0028296 A1* | 1/2015 | Jeong | G02B 5/3058 257/40 |
| 2017/0102487 A1 | 4/2017 | Lee et al. | |
| 2018/0072019 A1* | 3/2018 | Shimoji | C23C 14/06 |
| 2018/0100956 A1 | 4/2018 | Lee et al. | |
| 2018/0210306 A1* | 7/2018 | Okabe | H05B 33/10 |

FOREIGN PATENT DOCUMENTS

| | | |
|---|---|---|
| KR | 10-2017-0032503 | 3/2017 |
| KR | 10-2017-0125289 | 11/2017 |

\* cited by examiner

ELECTRONIC DISPLAY APPARATUS TO MITIGATE VISIBILITY OF TERMINAL WIRING IN NON-DISPLAY AREA

CROSS-REFERENCE TO RELATED APPLICATIONS

This application claims priority from and the benefit of Korean Patent Application No. 10-2019-0021011 filed on Feb. 22, 2019, which is hereby incorporated by reference for all purposes as if fully set forth herein.

BACKGROUND

Field

Exemplary embodiments of the invention relate generally to an electronic apparatus, and more particularly, relate to an electronic apparatus capable of improving a display characteristic.

Discussion of the Background

An electronic apparatus is activated in response to an input of an electrical signal. The electronic apparatus includes a display device to display an image or a touch screen to sense a touch from the outside.

The electronic apparatus may include various conductive patterns so as to be activated by an electrical signal. An area where conductive patterns are activated displays information or reacts to an external input, which is applied from the outside, such as a touch. The conductive patterns may include signal lines disposed in a peripheral area. Because the signal lines have high reflectivity to a light incident from the outside, the signal lines may be visible by a user.

The above information disclosed in this Background section is only for understanding of the background of the inventive concepts, and, therefore, it may contain information that does not constitute prior art.

SUMMARY

Exemplary embodiments of the inventive concepts provide an electronic apparatus capable of preventing or reducing signal lines from being visible due to reflection of external light.

An electronic apparatus includes a base substrate that includes an active area and a peripheral area adjacent to the active area, a plurality of pixels that are disposed in the active area, a plurality of pads that are disposed in the peripheral area, fan-out lines that are disposed in the peripheral area and connect the pixels and the pads, and an anti-reflection layer that includes an active portion and a peripheral portion. The active portion overlaps the active area and includes a plurality of color patterns respectively overlapping the pixels, and the peripheral portion overlaps the peripheral area. The anti-reflection layer overlaps at least a part of the fan-out lines in a plan view.

Additional features of the inventive concepts will be set forth in the description which follows, and in part will be apparent from the description, or may be learned by practice of the inventive concepts.

The base substrate may include a non-bending portion including the active area, and a bending portion bent from the non-bending portion around a given bending axis, and each of the fan-out lines includes a first portion disposed in the non-bending portion and a second portion disposed in the bending portion.

The first portion may overlap the peripheral portion in a plan view.

The color patterns may be arranged not to overlap each other in a plan view.

The active portion may further include a black matrix interposed between the color patterns.

Two color patterns adjacent to each other from among the color patterns have different colors.

The peripheral portion may have a single color.

The peripheral portion may have substantially a black color.

The peripheral portion may include a plurality of patterns that have different colors and are stacked.

Each of the fan-out lines may include a first portion that extends in a diagonal direction with respect to a direction in which the pads are arranged, and a second portion that extends in a perpendicular direction with respect to the direction in which the pads are arranged. The peripheral portion may overlap the first portion in a plan view.

A light transmittance of the peripheral portion may be about 10% or less.

The electronic apparatus according to an exemplary embodiment of the inventive concepts may further include an encapsulation layer that is disposed on the pixels and overlaps the active area and the peripheral area, and the anti-reflection layer may be directly disposed on the encapsulation layer.

The electronic apparatus according to an exemplary embodiment of the inventive concepts may include an input sensing unit that is disposed on the pixels to sense an external input. The input sensing unit may include a plurality of sensing patterns that are disposed in the active area, and a plurality of sensing lines that are disposed in the peripheral area and connected to the sensing patterns.

The anti-reflection layer may be interposed between the input sensing unit and the pixels.

The input sensing unit may further include a light blocking pattern covering the sensing patterns, each of the sensing patterns may include a plurality of mesh lines, and the light blocking pattern may be disposed along the mesh lines.

The anti-reflection layer may be disposed on the input sensing unit.

An electronic apparatus according to an exemplary embodiment of the inventive concepts includes a display unit that includes a plurality of pixels disposed in an active area, a plurality of signal lines connected to the pixels, pads disposed in a pad area, and fan-out lines connecting the signal lines and the pads, and an anti-reflection layer that is disposed on the display unit and includes an active portion including a plurality of color patterns arranged adjacent to each other and a peripheral portion having a single color in a plan view. The anti-reflection layer may overlap at least a part of the fan-out lines in a plan view.

Each of the fan-out lines may include a first portion extending in a diagonal direction with respect to a direction in which the pads are arranged, and a second portion extending in a perpendicular direction with respect to the direction in which the pads are arranged. The peripheral portion may overlap the first portion in a plan view.

The electronic apparatus according to an exemplary embodiment of the inventive concepts may further include an input sensing unit that is disposed on the display unit and includes a plurality of sensing patterns and a plurality of sensing lines connected with the sensing patterns. The anti-reflection layer may be interposed between the input sensing unit and the display unit.

A light transmittance of the peripheral portion may be about 10% or less.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, will become apparent by describing in detail exemplary embodiments thereof with reference to the accompanying drawings, and together with the description serve to explain the inventive concepts.

DETAILED DESCRIPTION

Figure 1A:
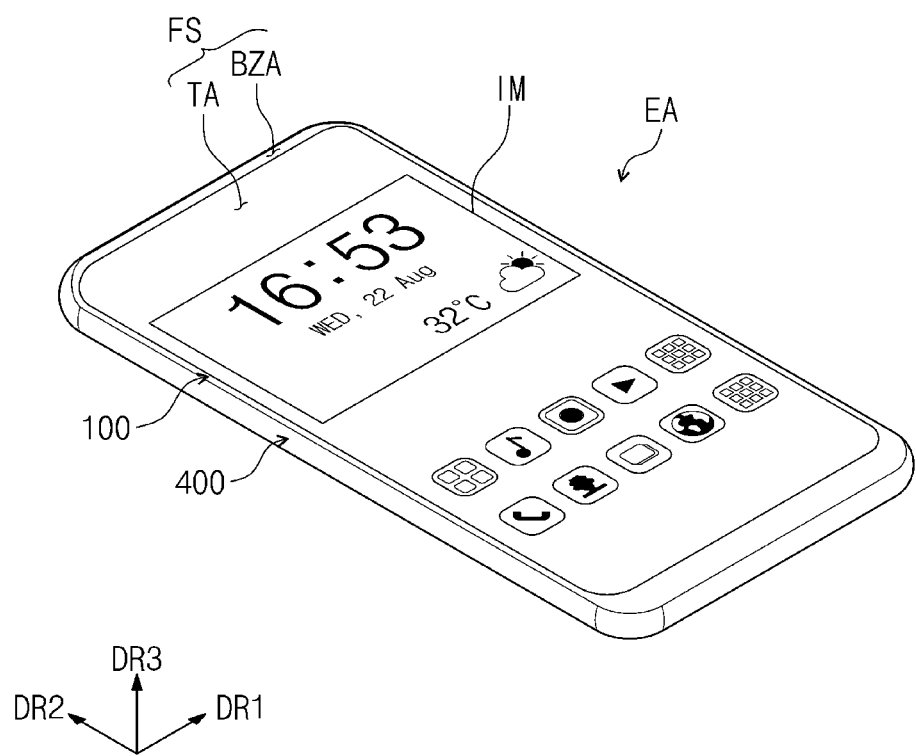
FIG. 1A is an assembled perspective view of an electronic apparatus according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Below, exemplary embodiments of the inventive concepts will be described with reference to accompanying drawings.

Figure 1B:
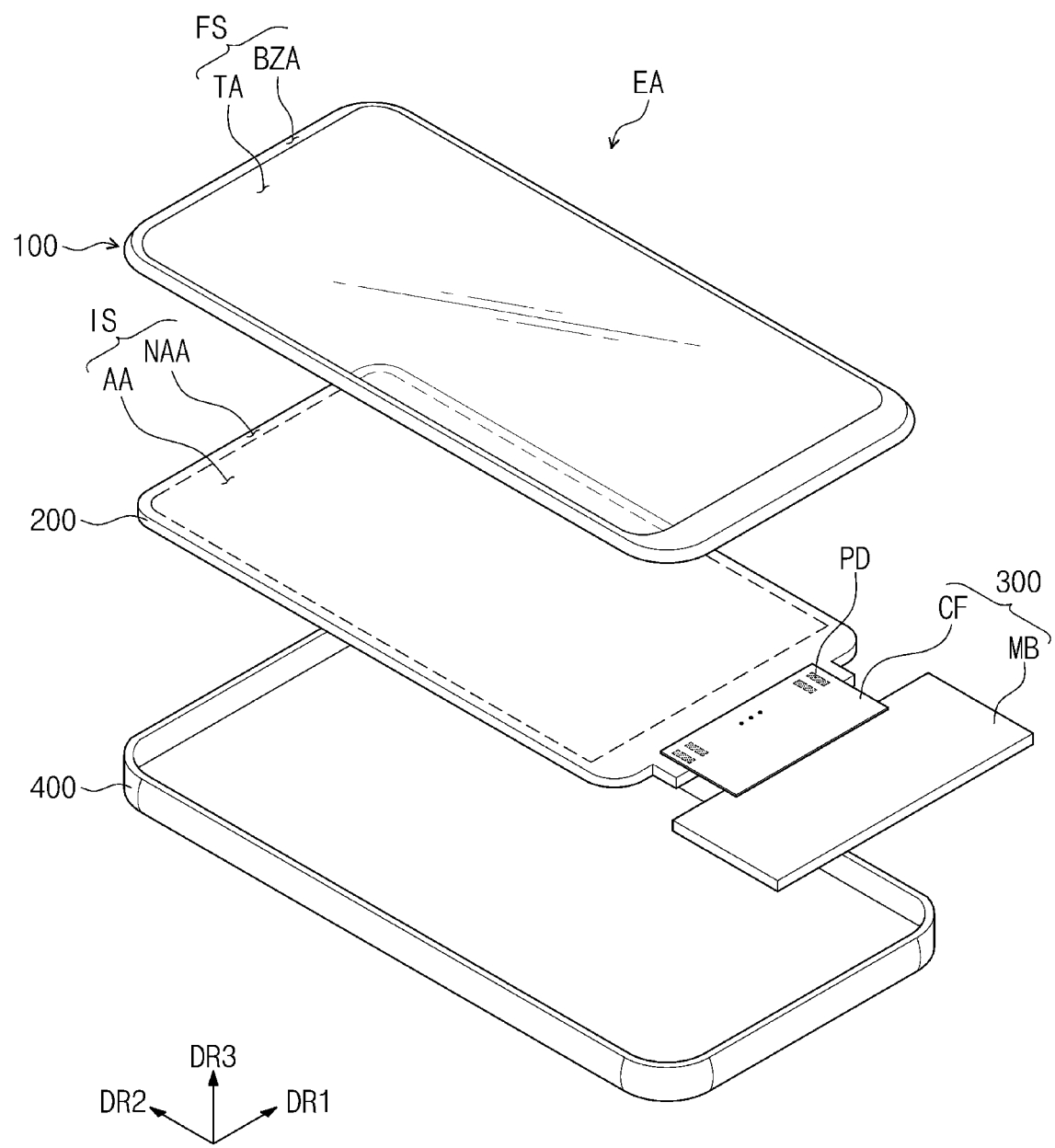
FIG. 1B is an exploded perspective view of an electronic apparatus according to an exemplary embodiment of the inventive concepts.
Figure 2A:
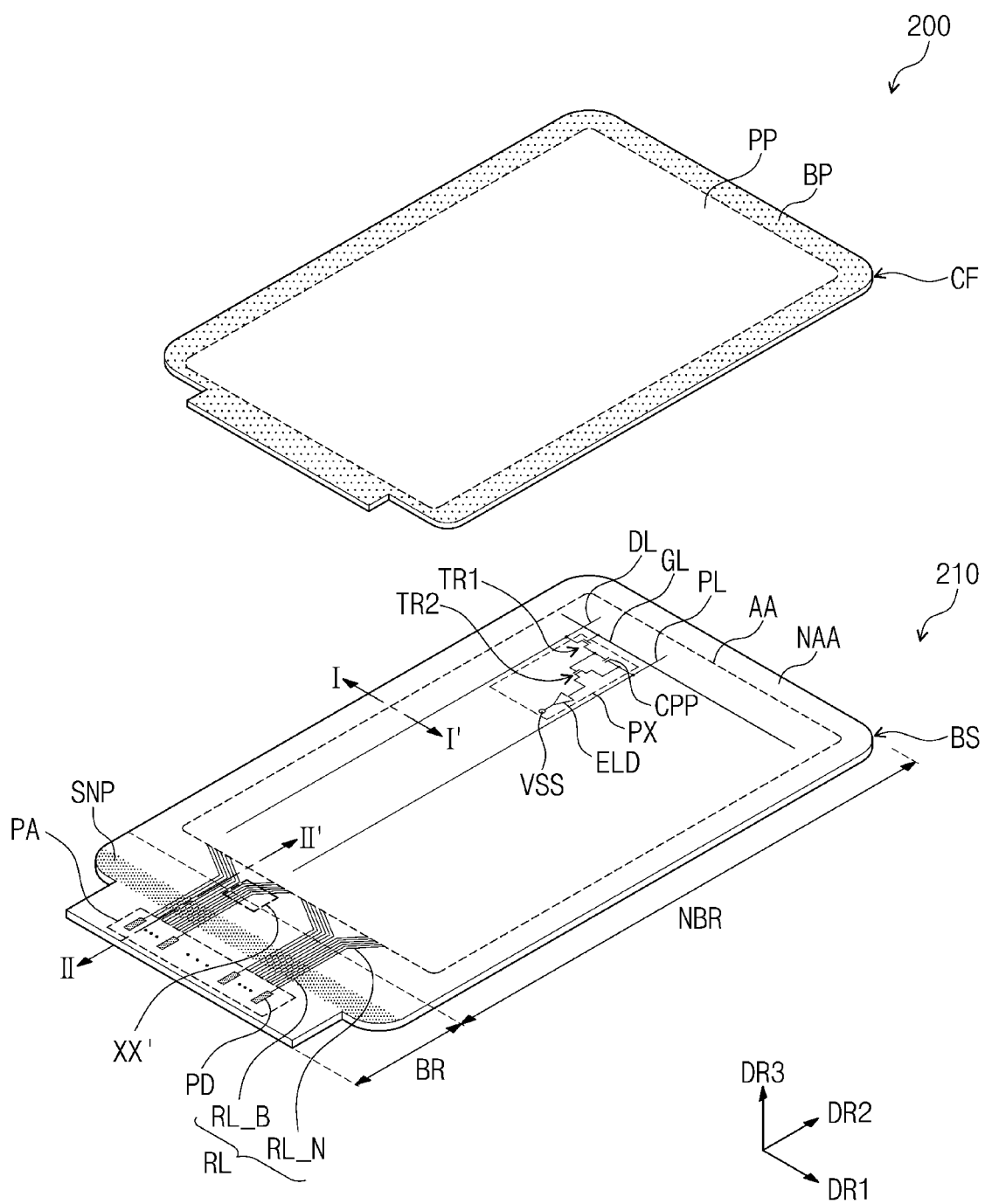
FIGS. 2A, 2B, and 2C are perspective views of a partial configuration illustrated in FIG. 1B.
Figure 2B:
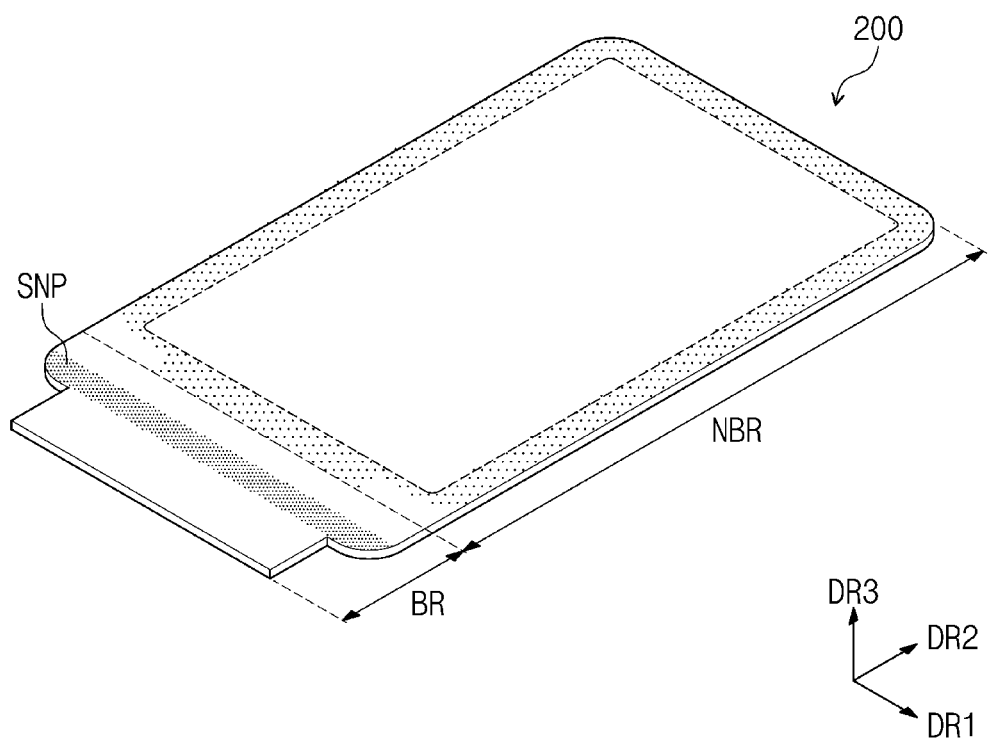
Figure 2C:
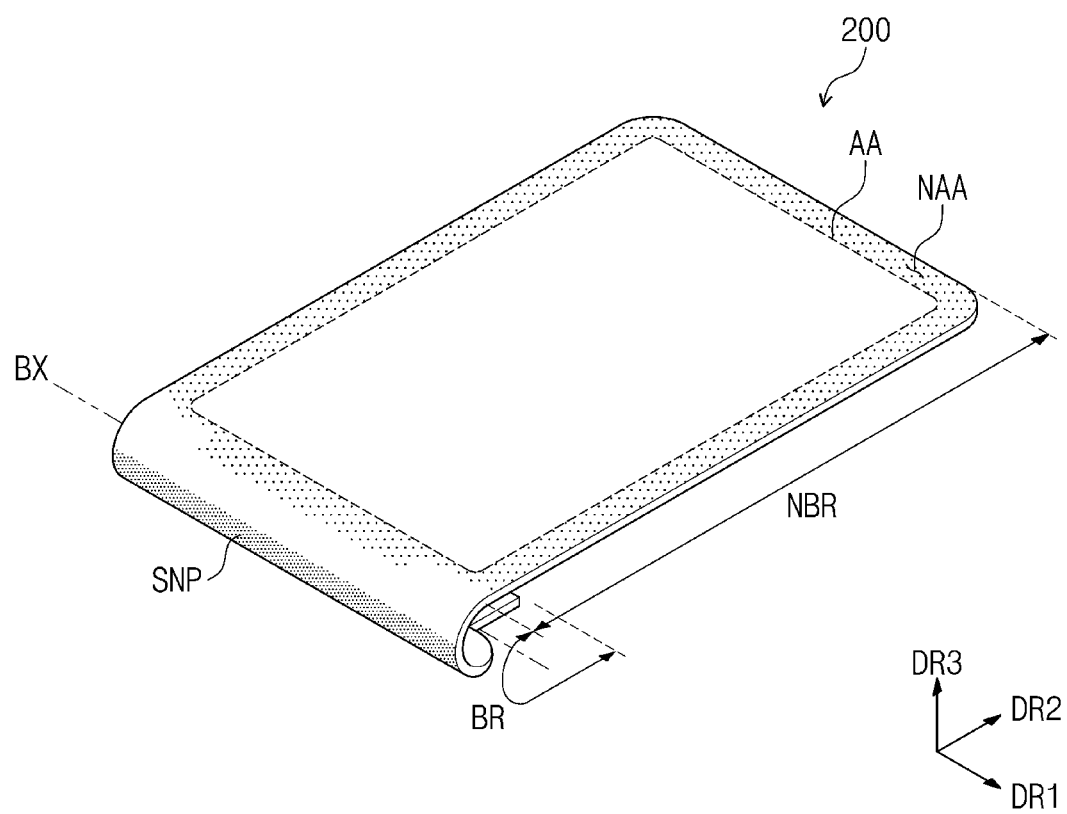
Figure 3A:
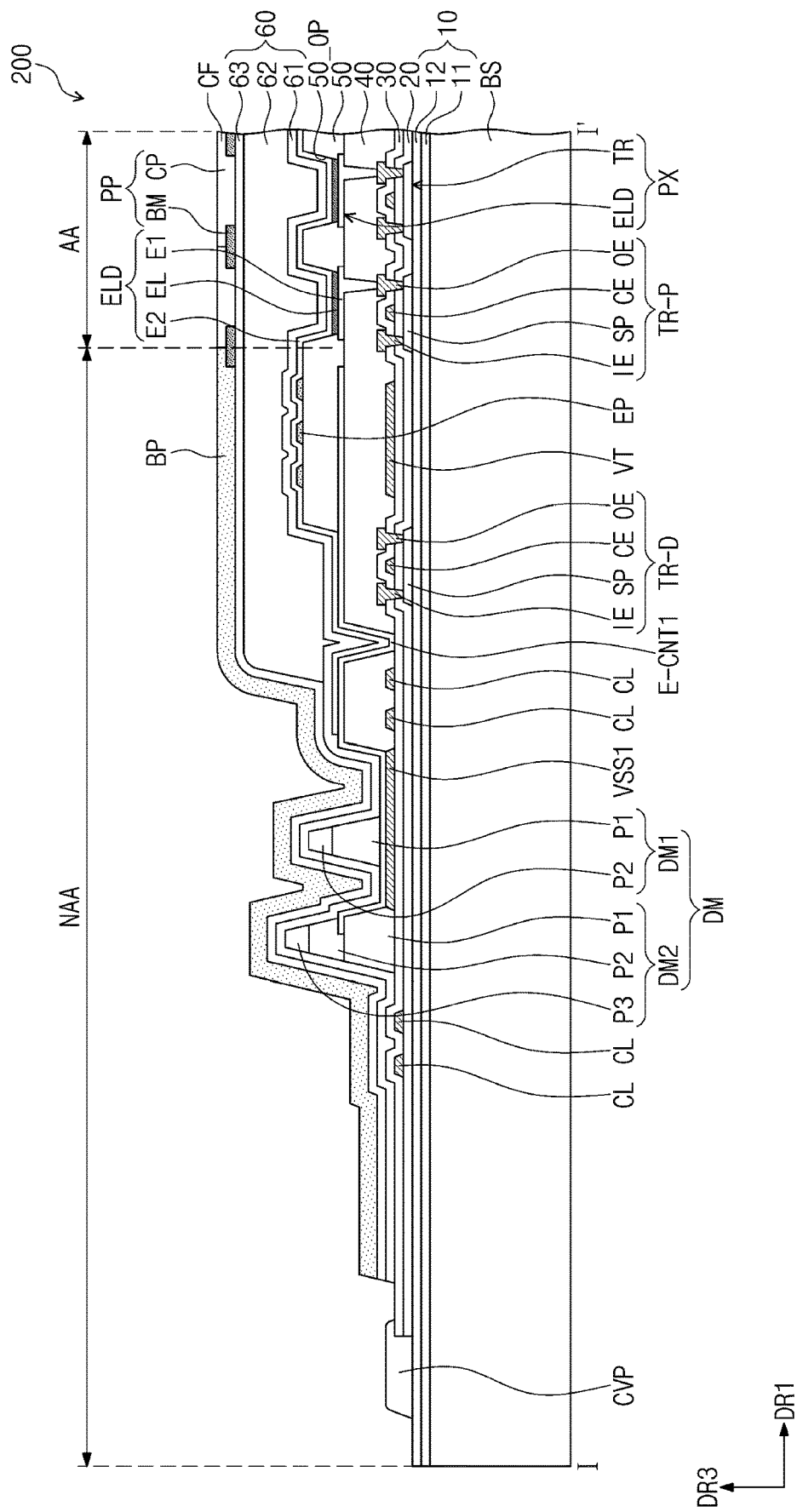
FIGS. 3A and 3B are cross-sectional views of a partial configuration illustrated in FIG. 1B.
Figure 3B:
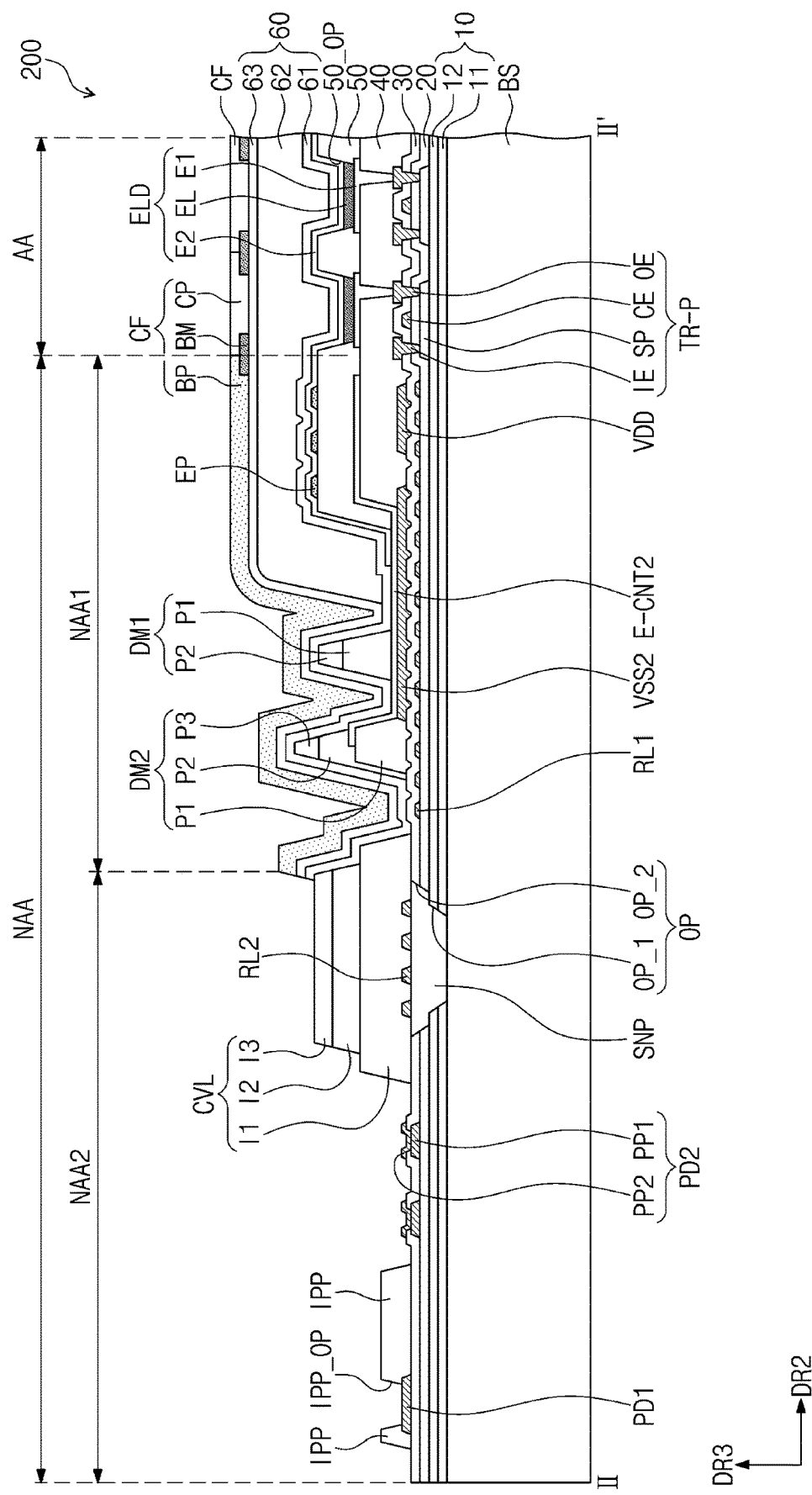

FIG. 1A is an assembled perspective view of an electronic apparatus according to an exemplary embodiment of the inventive concepts. FIG. 1B is an exploded perspective view of an electronic apparatus according to an exemplary embodiment of the inventive concepts. FIGS. 2A to 2C are perspective views of a partial configuration illustrated in FIG. 1B. FIGS. 3A and 3B are cross-sectional views of a partial configuration illustrated in FIG. 1B. Below, the inventive concepts will be described with reference to FIGS. 1A to 3B.

As illustrated in FIG. 1A, an electronic apparatus EA may display an image IM on a front surface. The front surface may be defined to be parallel to a surface that a first direction DR1 and a second direction DR2 define. The front surface includes a transparent area TA and a bezel area BZA adjacent to the transparent area TA.

The electronic apparatus EA displays the image IM in the transparent area TA. The image IM may include at least any one of a static image and a dynamic (or motion) image. An Internet search window is illustrated in FIG. 1A as an example of the image IM.

The transparent area TA may be in the shape of a rectangle where sides are parallel to the first direction DR1 and the second direction DR2. However, the transparent area TA according to the inventive concepts are not limited thereto. For example, the transparent area TA may have various shapes, not limited to any one exemplary embodiment.

The bezel area BZA is adjacent to the transparent area TA. The bezel area BZA surrounds the transparent area TA. However, the bezel area BZA according to the inventive concepts are not limited thereto. The bezel area BZA may be disposed adjacent to only one side of the transparent area TA or may be omitted. An electronic apparatus may be implemented with various exemplary embodiments, and is not limited to any one exemplary embodiment.

A normal direction of the front surface may correspond to a thickness direction DR3 (hereinafter referred to as a "third direction") of the electronic apparatus EA. In this exemplary embodiment, a front surface (or an upper surface) and a back surface (or a lower surface) of each member are defined with respect to a direction in which the image IM is displayed. The front surface and the back surface face each other in the third direction DR3.

Meanwhile, directions that the first, second, and third directions DR1, DR2, and DR3 indicate may be a relative concept and may be changed to different directions. Below, first, second, and third directions that are directions respectively indicated by the first, second, and third directions DR1, DR2, and DR3 are marked by the same reference symbols.

As illustrated in FIG. 1B, the electronic apparatus EA may include a window 100, an electronic panel 200, a circuit board 300, and an outer case 400. The window 100 and the outer case 400 are combined to define the exterior of the electronic apparatus EA.

The window 100 is disposed on the electronic panel 200 and covers a front surface FS of the electronic panel 200. The window 100 may include an optically transparent insulating material. For example, the window 100 may include glass or plastic. The window 100 may include a multi-layer or single-layer structure. For example, the window 100 may have a stacked structure of a plurality of plastic films bonded by an adhesive or may have a stacked structure of a glass substrate and a plastic film bonded by an adhesive.

The window 100 includes a front surface FS exposed to the outside. The front surface FS of the electronic apparatus EA may be defined by the front surface FS of the window 100.

In detail, the transparent area TA may be an optically transparent area. A shape of the transparent area TA may correspond to a shape of an active area AA. For example, the transparent area TA may overlap the whole surface of the active area AA or at least a portion of the whole surface thereof. The image IM that is displayed in the active area AA of the electronic panel 200 may be visible from the outside through the transparent area TA.

Light transmittance of the bezel area BZA may be relatively low in comparison to the transparent area TA. The bezel area BZA defines a shape of the transparent area TA.

The bezel area BZA is adjacent to the transparent area TA and surrounds the transparent area TA.

The bezel area BZA may have a given color. In the case where the window 100 is implemented with a glass or plastic substrate, the bezel area BZA may be a color layer that is printed or deposited on one surface of the glass or plastic substrate. Alternatively, the bezel area BZA may be formed by staining a relevant area of the glass or plastic substrate.

The bezel area BZA may cover a peripheral area NAA of the electronic panel 200 to prevent the peripheral area NAA from being visible from the outside. However, the inventive concepts are not limited thereto. For example, the window 100 according to an exemplary embodiment of the inventive concepts may not include the bezel area BZA.

The electronic panel 200 may display the image IM. The electronic panel 200 may be divided into the active area AA and the peripheral area NAA in a plan view.

The active area AA may be activated according to an electrical signal. In this exemplary embodiment, the image IM may be displayed in the active area AA.

The peripheral area NAA is adjacent to the active area AA. The peripheral area NAA surrounds an edge of the active area AA. However, the inventive concepts are not limited thereto. For example, the peripheral area NAA may be adjacent to only a portion of the edge of the active area AA, not limited to any one exemplary embodiment.

Various kinds of signal lines or pads PD providing electrical signals to the active area AA, or electronic elements may be disposed in the peripheral area NAA. Because the peripheral area NAA is covered by the bezel area BZA, the peripheral area NAA may not be visible from the outside.

The electronic panel 200 may include a display unit 210 and an anti-reflection layer CF. For easy description, an example is illustrated in FIG. 2A as the display unit 210 and the anti-reflection layer CF are separated.

The display unit 210 may generate the image IM and may display the image IM in the active area AA. The display unit 210 may include a base substrate BS, a plurality of signal lines GL, DL, PL, and RL, a pixel PX, and the plurality of pads PD.

A shape of the base substrate BS may correspond to a shape of the electronic panel 200 in a plan view. In detail, the base substrate BS may be a component that provides a bending portion BR and a non-bending portion NBR substantially. The base substrate BS may have ductility so as to be bendable. For example, the base substrate BS may be an insulating polymer film.

The signal lines GL, DL, PL, and RL are disposed on the base substrate BS. The signal lines GL, DL, PL, and RL may include a gate line GL, a data line DL, a power line PL, and routing wires RL. Each of the gate line GL, the data line DL, and the power line PL transfers an electrical signal to the pixels PX.

The gate line GL may extend along the first direction DR1. The gate line GL transfers a gate signal. The gate line GL may include a plurality of gate lines, which are arranged to be spaced from each other along the second direction DR2. However, only one gate line GL is illustrated for easy description.

The data line DL may extend along the second direction DR2. The data line DL transfers a data signal. The data line DL may be electrically isolated from the gate line GL. The data line DL may include a plurality of data lines, which are arranged to be spaced from each other along the first direction DR1. However, only one data line DL is illustrated for easy description.

The power line PL may extend along the second direction DR2. The power line PL may be electrically isolated from the gate line GL and the data line DL. The power line PL may include a plurality of power lines, which are arranged to be spaced from each other along the first direction DR1. However, only one power line PL is illustrated for easy description. The power line PL may provide a power signal (hereinafter referred to as a "first power signal") to the pixel PX.

The routing wires RL are disposed in the peripheral area NAA. The routing wires RL connect the pads PD and relevant signal lines, respectively. The signal lines may include the data line DL, the gate line GL, and the power line PL. However, the inventive concepts are not limited thereto. For example, the routing wires RL may be integrated with the relevant signal lines, not limited to any one exemplary embodiment.

The pixel PX emits a light in response to an electrical signal to implement the image IM. An equivalent circuit diagram of the pixel PX is illustrated in FIG. 2A. A single pixel PX is illustrated for easy description, but the display unit 210 may include a plurality of pixels PX. The pixel PX according to an exemplary embodiment of the inventive concepts may be implemented with various circuits, not limited to any one exemplary embodiment.

The pixel PX may include a first thin film transistor TR1, a second thin film transistor TR2, a capacitor CPP, and a light-emitting element ELD. The first thin film transistor TR1, the second thin film transistor TR2, the capacitor CPP, and the light-emitting element ELD are electrically connected.

The first thin film transistor TR1 may be a switching element to control turn-on and turn-off of the pixel PX. The first thin film transistor TR1 is connected to the gate line GL and the data line DL. The first thin film transistor TR1 is turned on by a gate signal provided through the gate line GL and provides the data signal provided through the data line DL to the capacitor CPP.

The capacitor CPP is connected to the first thin film transistor TR1 and the power line PL. The capacitor CPP stores charges, the amount of which corresponds to a difference between the data signal provided from the first thin film transistor TR1 and a first power supply voltage applied to the power line PL.

The second thin film transistor TR2 is connected to the first thin film transistor TR1, the capacitor CPP, and the light-emitting element ELD. The second thin film transistor TR2 may control a driving current flowing to the light-emitting element ELD based on the amount of charges stored in the capacitor CPP. A turn-on time period of the second thin film transistor TR2 may be determined according to the amount of charges stored in the capacitor CPP. The second thin film transistor TR2 provides the first power supply voltage from the power line PL to the light-emitting element ELD during the turn-on time period.

Depending on an electrical signal, the light-emitting element ELD may generate a light or may control the amount of light. For example, the light-emitting element ELD may include an organic light-emitting element, a quantum point light-emitting element, an electrophoretic element, or an electrowetting element.

The light-emitting element ELD is connected to the second thin film transistor TR2 and a power terminal VSS. The light-emitting element ELD emits a light based on a voltage corresponding to a difference between a signal provided through the second thin film transistor TR2 and a second power supply voltage from the power terminal VSS.

The light-emitting element ELD may emit a light during a turn-on time period of the second thin film transistor TR2.

The light-emitting element ELD includes a light-emitting material. The light-emitting element ELD may generate a light of a color corresponding to the light-emitting material. The color of the light generated by the light-emitting element ELD may be any one of a red color, a green color, a blue color, and a white color. However, the inventive concepts are not limited thereto. For example, the pixel PX may include electronic elements that are variously configured and arranged, not limited to any one exemplary embodiment.

An area illustrated in FIG. 3B may be a lower area of the electronic panel 200 adjacent to a pad area PA (refer to FIG. 2A) of the base substrate BS. As illustrated in FIG. 3B, a plurality of pads PD1 and PD2, a stress relaxation pattern SNP, a first power pattern VDD, a second power pattern VSS2, a connecting electrode E-CNT2, and routing wires RL1 and RL2 may be disposed in the lower area of the electronic panel 200.

The pads PD1 and PD2 may include the first pad PD1 and the second pad PD2. The first pad PD1 is disposed on a third insulating layer 30. The first pad PD1 is illustrated in a single-layer structure, but the inventive concepts are not limited thereto. For example, the first pad PD1 according to an exemplary embodiment of the inventive concepts may have a stacked structure of a plurality of layers, not limited to any one exemplary embodiment.

At least a portion of the first pad PD1 may be exposed by an insulating pattern IPP. The insulating pattern IPP is disposed on the third insulating layer 30. An opening IPP_OP defined in the insulating pattern IPP exposes at least a portion of the first pad PD1. The circuit board 300 (refer to FIG. 1B) is electrically connected to the electronic panel 200 through connection with the exposed portion of the first pad PD1.

The second pad PD2 is illustrated in a stacked structure. For example, the second pad PD2 includes a first pattern PP1 disposed on a second insulating layer 20 and a second pattern PP2 disposed on the third insulating layer 30. The second pattern PP2 passes through the third insulating layer 30 and is connected to the first pattern PP1. The circuit board 300 may be electrically connected to the electronic panel 200 through the second pattern PP2.

The first pad PD1 and the second pad PD2 may receive substantially different electrical signals. For example, the first pad PD1 may be any one of display pads, and the second pad PD2 may be any one of sensing pads. According to the inventive concepts, a signal for driving an input sensing unit 220 and a signal for sensing the display unit 210 may be provided in one electronic panel 200. As such, the degree of integration of the electronic panel 200 may be improved, and the thickness of the electronic apparatus EA (refer to FIG. 1A) may decrease.

In this exemplary embodiment, an example is illustrated as the first pad PD1 and the second pad PD2 are arranged along the second direction DR2. However, the inventive concepts are not limited thereto. The first pad PD1 and the second pad PD2 of the electronic panel 200 according to an exemplary embodiment of the inventive concepts may be arranged along the first direction DR1, not limited to any one exemplary embodiment.

The stress relaxation pattern SNP is disposed in the peripheral area NAA. For easy description, in this exemplary embodiment, a width in the second direction DR2 is illustrated to be relatively small in comparison to any other components. The stress relaxation pattern SNP may include a material having ductility. For example, the stress relaxation pattern SNP may include an organic material.

The stress relaxation pattern SNP may be disposed in an opening OP defined in an insulating layer. The opening OP may be formed by connecting an opening OP_1 passing through a first insulating layer 10 and an opening OP_2 passing through the second insulating layer 20 and the third insulating layer 30.

The stress relaxation pattern SNP may overlap a part of the routing wires RL in a plan view. The stress relaxation pattern SNP may alleviate a bending stress when a portion of the electronic panel 200, for example, the bending portion BR is bent. As such, the routing wires RL disposed on the stress relaxation pattern SNP may be prevented from being damaged when the bending portion BR is bent. This may mean that the reliability of the electronic panel 200 is improved.

The routing wires RL may include the first routing wire RL1 and the second routing wire RL2. The first routing wire RL1 and the second routing wire RL2 may be disposed on different layers.

An example is illustrated as the first routing wires RL1 are interposed between the second insulating layer 20 and the third insulating layer 30. In this exemplary embodiment, the first routing wires RL1 may be disposed on the same layer as a control electrode CE. The first routing wires RL1 may be electrically connected to any one of various control signal lines electrically connected to a data line DL, a gate line GL, and the active area AA.

An example is illustrated as the second routing wires RL2 are interposed between the third insulating layer 30 and a fourth insulating layer 40. In this exemplary embodiment, the second routing wires RL2 may be disposed on the same layer as an input electrode IE or an output electrode OE.

Although not illustrated in drawings, a part of the first routing wires RL1 may be electrically connected to the second routing wires RL2. The second routing wires RL2 passes through the third insulating layer 30 and is connected to the corresponding first routing wires RL1. For easy description, an example is illustrated in FIG. 3B as only the second routing wire RL2 is disposed on the stress relaxation pattern SNP. However, the inventive concepts are not limited thereto. For example, the first routing wire RL1 and the second routing wire RL2 may be alternately disposed on the stress relaxation pattern SNP, not limited to any one exemplary embodiment. Also, for easy description, an example is illustrated in FIG. 3B as a plurality of second routing wires RL2 are disposed on the stress relaxation pattern SNP. However, the second routing wire RL2 disposed in FIG. 3B may be implemented one wire formed by connecting wires, not limited to any one exemplary embodiment.

The first power pattern VDD is connected to the above power line PL. The first power pattern VDD is connected through any one of the routing wires RL to a pad, to which the first power signal is applied, from among the pads PD1 and PD2 and is provided with the first power signal. The first power pattern VDD may be connected to a plurality of first power lines and may provide the same power signal (i.e., the first power signal) to the first power lines, respectively. However, the inventive concepts are not limited thereto. For example, the electronic panel 200 may not include the first power pattern VDD, not limited to any one exemplary embodiment.

The second power pattern VSS2 is disposed on the third insulating layer 30. The second power pattern VSS2 is connected through any one of the routing wires RL to a pad, to which a second power signal is applied, from among the pads PD1 and PD2 and is provided with the second power signal. The second power pattern VSS2 is connected to the above power supply line VSS1.

The connecting electrode E-CNT2 may be disposed in the fourth insulating layer 40 and may be disposed on the same layer as a first electrode E1. The connecting electrode E-CNT2 may cover an upper surface of the second power pattern VSS2 and may be connected to the second power pattern VSS2. A second electrode E2 is extended from the active area AA and is connected to the connecting electrode E-CNT2. As such, the second power signal provided to the second power pattern VSS2 may be easily applied to the second electrode E2. The connecting electrode E-CNT2 may be substantially the same component as a connecting electrode E-CNT1 illustrated in FIG. 3A.

The electronic panel 200 may include dam portions DM1 and DM2 and a cover pattern CVL. The dam portions DM1 and DM2 may include the first dam portion DM1 and the second dam portion DM2. The first and second dam portions DM1 and DM2 are sequentially arranged along a direction facing away from the active area AA, that is, a direction facing away from the second direction DR2.

The dam portions DM1 and DM2 prevent an overflow of an organic layer 62. The dam portions DM1 and DM2 may be integrated with the dam portions DM1 and DM2 illustrated in FIG. 3A or may be separated from the dam portions DM1 and DM2 illustrated in FIG. 3A. Each of the dam portions DM1 and DM2 may include two layers P1 and P2 or may include three layers P1, P2, and P3. Each of the dam portions DM1 and DM2 may have various structures, not limited to any one exemplary embodiment.

The cover pattern CVL may be disposed on the stress relaxation pattern SNP. The s routing wire RL may be covered by the cover pattern CVL. The cover pattern CVL may include a first layer I1, a second layer I2, and a third layer I3. The cover pattern CVL is illustrated in a stacked structure. The cover pattern CVL may protect the stress relaxation pattern SNP and the routing wire RL.

The anti-reflection layer CF is disposed on the display unit 210. The anti-reflection layer CF includes an active portion PP and a peripheral portion BP. The active portion PP may correspond to the active area AA. The active portion PP covers the active area AA in a plan view. The active portion PP may include a plurality of color filters that are arranged for each pixel PX and have different colors. This will be more fully described later.

The peripheral portion BP is adjacent to the active portion PP. The peripheral portion BP may correspond to the peripheral area NAA. The peripheral portion BP exposes the active area AA and covers at least a portion of the peripheral area NAA. The peripheral portion BP may include a pattern having a single color or may include a plurality of color patterns that are stacked in a cross-sectional view and have different colors. This will be more fully described later.

Returning to FIG. 1B, the circuit board 300 may be connected to the electronic panel 200. The circuit board 300 may include a flexible board CB and a main board MB. The flexible board CB may include an isolating film and conductive wires mounted on the isolating film. The conductive wires are connected to the pads PD and electrically connect the circuit board 300 and the electronic panel 200. In another exemplary embodiment, the flexible board CB may not be included. In this case, the main board MB may be directly connected to the electronic panel 200.

The main board MB may include signal lines (not illustrated) and electronic elements (not illustrated). The electronic elements may be electrically connected to the electronic panel 200 through the signal lines. The electronic elements generate various electrical signals, for example, a signal for generating the image IM. The main board MB may be provided for each of signals to be generated and processed, not limited to any one exemplary embodiment.

The outer case 400 is disposed under the electronic panel 200. The outer case 400 may include a material having relatively great stiffness in comparison to the electronic panel 200. For example, the outer case 400 may include a plurality of frames and/or plates formed of glass, plastic, and metal.

The outer case 400 provides a given accommodation space. The electronic panel 200 and the circuit board 300 may be accommodated in the accommodation space and may be protected from external shock. According to the inventive concepts, the electronic apparatus EA may provide a use environment capable of displaying the image IM through one electronic panel 200 and simultaneously sensing an external input TC. As such, the thickness of the electronic apparatus EA may decrease, and the electronic apparatus EA may be easy to assemble.

A portion of the electronic panel 200 according to an exemplary embodiment of the inventive concepts may be bendable. For example, as illustrated in FIGS. 2B and 2C, the electronic panel 200 may include the non-bending portion NBR and the bending portion BR. FIG. 2B shows the electronic panel 200 that is not bent, and the FIG. 2C shows the electronic panel 200 that is bent.

The bending portion BR may be bent by an external force around a bending axis BX extending along the first direction DR1. The bending axis BX may be defined on a back surface of the electronic panel 200.

The electronic panel 200 may further include the stress relaxation pattern SNP disposed in the bending portion BR. The stress relaxation pattern SNP may be interposed between the active area AA and the pad area PA where the pads PD are disposed. The stress relaxation pattern SNP may include an organic material. When the bending portion BR is bent, the stress relaxation pattern SNP may prevent the bending portion BR from being damaged by a bending stress.

As the bending portion BR is bent to cover the bending axis BX, the area of the peripheral area NAA may decrease when viewed from above the front surface FS of the window 100. As such, the bezel area BZA may decrease, and thus, the sense of beauty of the electronic apparatus EA may be improved. However, the inventive concepts are not limited thereto. For example, the electronic panel 200 may not include the bending portion BR.

The routing wires RL may include a first portion RL_N and a second portion RL_B. The first portion RL_N may include routing wires disposed in the non-bending portion NBR from among the routing wires RL. The first portion RL_N may face a front surface together with the active area AA when the electronic panel 200 is bent.

In this exemplary embodiment, the first portion RL_N may extend in a diagonal direction with respect to the first direction DR1 and the second direction DR2. The first portion RL_N may be spread (or split) toward the active area AA and may come together toward the second portion RL_B.

The second portion RL_B may include routing wires disposed in the bending portion BR from among the routing wires RL. The second portion RL_B is connected to the pads PD disposed in the pad area PA.

The first portion RL_N may be covered by the anti-reflection layer CF. The peripheral portion BP of the anti-reflection layer CF may protrude toward the bending portion BR so as to overlap the first portion RL_N in a plan view. As such, the first portion RL_N of the routing wires RL may be covered by the peripheral portion BP, thus preventing or reducing the first portion RL_N from being visible by the user from the front surface FS of the electronic panel 200.

FIG. 3A is a cross-sectional view taken along a line I-I' illustrated in FIG. 2A. FIG. 3B is a cross-sectional view taken along a line II-II' illustrated in FIG. 2A. Below, the inventive concepts will be described with reference to FIGS. 3A and 3B.

As illustrated in FIGS. 3A and 3B, the electronic panel 200 may include the base substrate BS, the pixel PX, a plurality of insulating layers 10, 20, 30, 40, 50, and 60, and the anti-reflection layer CF. For easy description, a thin film transistor TR-P (hereinafter referred to as a "pixel transistor") and a light-emitting element ELD of components of the pixel PX are illustrated in FIG. 3A.

The base substrate BS may include an insulating material. For example, the base substrate BS may include polyimide (PI). As such, as illustrated in FIG. 2C, at least a portion of the electronic panel 200 may be easily bent. However, the inventive concepts are not limited thereto. For example, the base substrate BS may be provided in a rigid state. For example, the base substrate BS may be formed of various materials such as glass and plastic, not limited to any one exemplary embodiment.

The first insulating layer 10 is disposed on the base substrate BS. The first insulating layer 10 covers a front surface of the base substrate BS. The first insulating layer 10 may include a barrier layer 11 and a buffer layer 12.

The barrier layer 11 may include an inorganic material. The barrier layer 11 may prevent oxygen or moisture introduced through the base substrate BS from being infiltrated into the pixel PX. The buffer layer 12 may include an inorganic material. The buffer layer 12 may have lower surface energy than the base substrate BS such that the pixel PX is stably formed on the base substrate BS.

For easy description, each of the barrier layer 11 and the buffer layer 12 is illustrated in FIG. 3A as a single layer. However, the inventive concepts are not limited thereto. For example, each of the barrier layer 11 and the buffer layer 12 according to an exemplary embodiment of the inventive concepts may be implemented in a multi-layer structure where the barrier layer 11 and the buffer layer 12 are alternately stacked. Alternatively, at least any one of the barrier layer 11 and the buffer layer 12 may be implemented in a multi-layer structure or may not be included.

The pixel transistor TR-P includes a semiconductor pattern SP, the control electrode CE, the input electrode IE, and the output electrode OE. The semiconductor pattern SP is disposed on the base substrate BS. The semiconductor pattern SP may include a semiconductor material. The control electrode CE is spaced from the semiconductor pattern SP with the second insulating layer 20 interposed therebetween. The control electrode CE may be connected to the first thin film transistor TR1 and one electrode of the capacitor CPP.

The input electrode IE and the output electrode OE are spaced from the control electrode CE with the third insulating layer 30 interposed therebetween. The input electrode IE and the output electrode OE of the pixel transistor TR-P are respectively connected to a first end and a second end of the semiconductor pattern SP through the second insulating layer 20 and the third insulating layer 30.

The fourth insulating layer 40 is disposed on the third insulating layer 30 and covers the input electrode IE and the output electrode OE. The fourth insulating layer 40 may include an organic material and/or an inorganic material, and may have a single-layer or multi-layer structure.

In the pixel transistor TR-P, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer as the semiconductor pattern SP and may be directly connected with the semiconductor pattern SP. The pixel transistor TR-P according to an exemplary embodiment of the inventive concepts may be implemented with various structures, not limited to any one exemplary embodiment.

The light-emitting element ELD is disposed on the fourth insulating layer 40. The light-emitting element ELD includes the first electrode E1, a light-emitting layer EL, and the second electrode E2. The first electrode E1 may pass through the fourth insulating layer 40 and may be connected to the pixel transistor TR-P. Although not illustrated in drawings, the electronic panel 200 may further include a separate connecting electrode interposed between the first electrode E1 and the pixel transistor TR-P. In this case, the first electrode E1 may be electrically connected to the pixel transistor TR-P through the connecting electrode.

The fifth insulating layer 50 is disposed on the fourth insulating layer 40. An opening 50_OP may be defined in the fifth insulating layer 50. The opening 50_OP exposes at least a portion of the first electrode E1. The fifth insulating layer 50 may include an organic material. In this exemplary embodiment, the fifth insulating layer 50 may be a pixel defining film.

The light-emitting layer EL is disposed in the opening 50_OP so as to be disposed on the first electrode E1 exposed by the opening 50_OP. The light-emitting layer EL may include a light-emitting material. For example, the light-emitting layer EL may be formed of any one of materials of emitting a light of a red color, a green color, and a blue color, and may include a fluorescent material or a phosphorescence material. The light-emitting layer EL may include an organic light-emitting material or an inorganic light-emitting material. The light-emitting layer EL may emit a light in response to a potential difference between the first electrode E1 and the second electrode E2.

The second electrode E2 is disposed on the light-emitting layer EL. The second electrode E2 may face the first electrode E1. The second electrode E2 may be integrally extended from the active area AA to the peripheral area NAA. The second electrode E2 may be provided in common to a plurality of pixels. The light-emitting element ELD disposed in each pixel receives the second power supply voltage through the second electrode E2.

The second electrode E2 may include a transparent conductive material or a translucent conductive material. As such, a light that is generated from the light-emitting layer EL may be easily emitted toward the third direction DR3 through the second electrode E2. However, the inventive concepts are not limited thereto. Depending on a design, the light-emitting element ELD according to an exemplary embodiment of the inventive concepts may be driven in a back emission manner where the first electrode E1 includes a transparent or translucent material or in a dual emission manner in which a light is emitted toward both a front surface and a back surface, not limited to any one exemplary embodiment.

The sixth insulating layer 60 is disposed on the light-emitting element ELD and seals the light-emitting element ELD. In this exemplary embodiment, the sixth insulating layer 60 may be an encapsulation layer. The sixth insulating layer 60 may be integrally extended from the active area AA to the peripheral area NAA. The sixth insulating layer 60 may be provided in common to the plurality of pixels. Although not illustrated in drawings, a capping layer covering the second electrode E2 may be further interposed between the second electrode E2 and the sixth insulating layer 60.

The sixth insulating layer 60 may include a first inorganic layer 61, the organic layer 62, and a second inorganic layer 63 that are sequentially stacked along the third direction DR3. In this exemplary embodiment, each of the first inorganic layer 61, the organic layer 62, and the second inorganic layer 63 is illustrated as a single layer. However, the inventive concepts are not limited thereto. For example, at least one of the first inorganic layer 61, the organic layer 62, and the second inorganic layer 63 may be implemented in, but is not limited to, a multi-layer structure or may not be included.

The first inorganic layer 61 may cover the second electrode E2. The first inorganic layer 61 may prevent external moisture or oxygen from being infiltrated into the light-emitting element ELD. For example, the first inorganic layer 61 may include silicon nitride, silicon oxide, or a combination thereof. The first inorganic layer 61 may be formed through a deposition process.

The organic layer 62 may be disposed on the first inorganic layer 61 and may be in contact with the first inorganic layer 61. The organic layer 62 may provide a flat surface on the first inorganic layer 61. In detail, the organic layer 62 may provide the flat surface to the active area AA.

A curve formed on an upper surface of the first inorganic layer 61 or particles present on the first inorganic layer 61 are covered by the organic layer 62, thus preventing a surface state of the upper surface of the first inorganic layer 61 from having an influence on components formed on the organic layer 62. Also, the organic layer 62 may alleviate a stress between contacting layers. The organic layer 62 may include an organic material and may be formed through a solution process such as a spin coating process, a slit coating process, or an inkjet process.

The second inorganic layer 63 is disposed on the organic layer 62 and covers the organic layer 62. The second inorganic layer 63 may be stably formed on a relatively flat surface, not the first inorganic layer 61. The second inorganic layer 63 may block moisture discharged from the organic layer 62 to prevent the moisture from being discharged to the outside. The second inorganic layer 63 may include silicon nitride, silicon oxide, or a combination thereof. The second inorganic layer 63 may be formed through a deposition process.

According to the inventive concepts, the electronic panel 200 may further include a thin film transistor TR-D (hereinafter referred to as a "driving transistor"), a plurality of signal patterns VSS1, E-CNT1, VT, and CL, and the plurality of dam portions DM1 and DM2 disposed on the peripheral area NAA.

The driving transistor TR-D, the signal patterns VSS1, E-CNT1, VT, and CL, and the dam portions DM1 and DM2 constitute the display unit 210 (refer to FIG. 2C). A part of the driving transistor TR-D and the signal patterns VSS1, E-CNT1, VT, and CL may constitute a gate driving circuit that provides a gate signal to the gate line GL.

An example is illustrated as the driving transistor TR-D has a structure corresponding to the pixel transistor TR-P. For example, the driving transistor TR-D may include the semiconductor pattern SP disposed on the first insulating layer 10, the control electrode CE disposed on the second insulating layer 20, and the input electrode IE and the output electrode OE disposed on the third insulating layer 30.

As such, the pixel transistor TR-P and the driving transistor TR-D may be simultaneously formed within the same process, thus making it possible to simplify a process and to reduce process costs. However, the inventive concepts are not limited thereto. The driving transistor TR-D according to an exemplary embodiment of the inventive concepts may include electrodes and a semiconductor pattern disposed on a different layer from the pixel transistor TR-P or may have a different structure from the pixel transistor TR-P, without limitation to any one exemplary embodiment.

The signal patterns VSS1, E-CNT1, VT, and CL may include the power supply line VSS1, the connecting electrode E-CNT1, the initialization voltage line VT, and the driving signal line CL. The power supply line VSS1 may correspond to the power terminal VSS of the pixel PX. The power supply line VSS1 supplies the second power supply voltage to the light-emitting element ELD.

The power supply line VSS1 is disposed on the third insulating layer 30. The power supply line VSS1 is disposed on the same layer as the input electrode IE or the output electrode OE of the driving transistor TR-D. The power supply line VSS1 may be simultaneously patterned within the same process as the input electrode IE or the output electrode OE of the driving transistor TR-D by using one mask. However, the inventive concepts are not limited thereto. For example, the power supply line VSS1 may be disposed on a different layer as the input electrode IE or the output electrode OE of the driving transistor TR-D through a separate process, not limited to any one exemplary embodiment.

The connecting electrode E-CNT1 is disposed on the fourth insulating layer 40. The connecting electrode E-CNT1 is electrically connected to the power supply line VSS1. The connecting electrode E-CNT1 covers the power supply line VSS1 exposed through the fourth insulating layer 40.

The second electrode E2 of the light-emitting element ELD is extended from the active area AA and is connected to the connecting electrode E-CNT1. The connecting electrode E-CNT1 may receive the second power supply voltage from the power supply line VSS1. As such, the second power supply voltage may be provided to the second electrode E2 through the connecting electrode E-CNT1 such that the second power supply voltage is supplied in common to the respective pixels.

The connecting electrode E-CNT1 is disposed on the same layer as the first electrode E1 of the light-emitting element ELD and may be formed at the same time with the first electrode E1. However, the inventive concepts are not limited thereto. For example, the connecting electrode E-CNT1 may be disposed on a different layer from the first electrode E1.

The driving signal line CL may include a plurality of driving signal lines and may be disposed on the third insulating layer 30. The driving signal lines CL may be disposed in the peripheral area NAA. The driving signal line CL may be a routing wire connected with a pad (not illustrated) or may be a wire of an integrated circuit (IC). The driving signal lines CL are spaced from each other in the first direction DR1 and transfer electrical signals independently of each other.

The initialization voltage line VT provides an initialization voltage to the pixel PX. Although not illustrated in drawings, the initialization voltage line VT may include a plurality of initialization voltage lines such that the initialization voltage is provided to the respective pixels.

The driving signal lines CL and the initialization voltage line VT may be disposed on the same layer and may be formed simultaneously through the same process. However, the inventive concepts are not limited thereto. For example, the driving signal lines CL and the initialization voltage line VT may be independently formed through separate processes.

A dam portion (DM1, DM2) is disposed in the peripheral area NAA. The dam portion (DM1, DM2) may prevent the organic layer 62 from overflowing toward outer sides of the dam portion (DM1, DM2), that is, toward a direction facing away from the first direction DR1 in FIG. 3A from the active area AA.

The dam portion (DM1, DM2) may be disposed adjacent to at least one side of the active area AA. The dam portion (DM1, DM2) may surround the active area AA in a plan view. The dam portion (DM1, DM2) may include a plurality of dam portions, for example, the first dam portion DM1 and the second dam portion DM2.

The first dam portion DM1 may be relatively close to the active area AA in comparison with the second dam portion DM2. The first dam portion DM1 may be disposed to overlap the power supply line VSS1 in a plan view. In this exemplary embodiment, the connecting electrode E-CNT1 may pass between the first dam portion DM1 and the power supply line VSS1 in a cross-sectional view.

In this exemplary embodiment, the first dam portion DM1 may include the same material as the fifth insulating layer 50 and may be formed through one mask at the same time with the fifth insulating layer 50. As such, a separate process may not be required to form the first dam portion DM1, thus making it possible to reduce process costs and to simplify a process.

The second dam portion DM2 may be disposed on a relatively outer side in comparison with the first dam portion DM1. The second dam portion DM2 may be placed to cover a portion of the power supply line VSS1. In this exemplary embodiment, the second dam portion DM2 may have a multi-layer structure including a first layer P1, a second layer P2, and a third layer P3.

In this exemplary embodiment, a portion of the connecting electrode E-CNT1 may be disposed on the first layer P1 of the second dam portion DM2 so as to overlap the first layer P1. One end of the connecting electrode E-CNT1 may be inserted between the first layer P1 and the second layer P2. However, the inventive concepts are not limited thereto. For example, the connecting electrode E-CNT1 may not be extended up to the second dam portion DM2, not limited to any one exemplary embodiment.

A cover pattern CVP is disposed on the first insulating layer 10. The cover pattern CVP may cover one ends of the second insulating layer 20 and the third insulating layer 30. The cover pattern CVP may prevent the separation of the second insulating layer 20 and the third insulating layer 30 and may prevent a damage of the second insulating layer 20 and the third insulating layer 30 due to external shock.

The anti-reflection layer CF is disposed on the sixth insulating layer 60. As described above, the anti-reflection layer CF includes the active portion PP and the peripheral portion BP. The active portion PP corresponds to the active area AA.

The active portion PP may include a plurality of color patterns CP and a black matrix BM. The color patterns CP are disposed to correspond to the pixels PX, respectively. Each of the color patterns CP overlaps the light-emitting element ELD in a plan view. The color patterns CP are disposed to overlap the openings 50_OP, respectively.

Each of the color patterns CP may have a single color. Also, color patterns adjacent to each other from among the color patterns CP may have different colors. However, the inventive concepts are not limited thereto. For example, a part of color patterns adjacent to each other from among the color patterns CP may have the same color, not limited to any one exemplary embodiment.

Each of the color patterns CP may include dye, pigment, or a combination thereof. Alternatively, each of the color patterns CP may include a fluorescent material or a phosphorescence material. Alternatively, each of the color patterns CP may include an inorganic light-emitting material.

The black matrix BM may be interposed between the color patterns CP. The black matrix BM may include a light blocking material. The black matrix BM may have a color of low brightness, substantially, a black color. The black matrix BM may compart light-emitting areas defined by the respective pixels PX and may prevent a light from being leaked out to the surroundings of the light-emitting areas.

In this exemplary embodiment, the black matrix BM is disposed to overlap a boundary between the color patterns CP in a plan view, and two color patterns adjacent to each other from among the color patterns CP are illustrated to overlap each other on the black matrix BM. However, the inventive concepts are not limited thereto. For example, the black matrix BM may be formed to have the same thickness as the color patterns CP, not limited to any one exemplary embodiment.

The peripheral portion BP is disposed in the peripheral area NAA. In this exemplary embodiment, the peripheral portion BP is illustrated to cover the whole surface of the second inorganic layer 63. The peripheral portion BP may overlap the driving signal lines CL, the power supply line VSS1, and the routing wires RL in a plan view.

The peripheral portion BP may have a given color. For example, the peripheral portion BP may have any one of colors of the respective color patterns CP. Alternatively, the peripheral portion BP may have a color corresponding to a combination of a plurality of colors of the colors of the respective color patterns CP. Alternatively, the peripheral portion BP may have a color corresponding to a color of the black matrix BM.

Referring to FIG. 3B, the peripheral area NAA may include a first area NAA1 and a second area NAA2 divided by the anti-reflection layer CF. The first area NAA1 may be an area, which is covered by the anti-reflection layer CF, in particular, the peripheral portion BP, of the peripheral area NAA. The first area NAA1 may be covered by the peripheral portion BP and may have low reflectivity to a light incident from the outside.

The second area NAA2 may be an area, which does not overlap the anti-reflection layer CF, of the peripheral area NAA. The pads PD1 and PD2 are disposed in the second area NAA2 and are exposed from the peripheral portion BP. As such, the pads PD1 and PD2 may be easily connected with a terminal mounted on the circuit board 300.

The peripheral portion BP may cover the peripheral area NAA, thus preventing or reducing signal wires disposed in the peripheral area NAA from being visible by the user. As illustrated in FIG. 3A, the peripheral portion BP may overlap various signal patterns E-CNT1, VSS1, and CL disposed in the peripheral area NAA in a plan view, thus preventing or reducing the signal patterns E-CNT1, VSS1, and CL from being visible due to reflection of an external light. Also, as illustrated in FIG. 3B, the peripheral portion BP may overlap various signal patterns RL1, RL2, E-CNT2, and VSS2 disposed in the peripheral area NAA in a plan view, thus preventing or reducing the signal patterns RL1, RL2, E-CNT2, and VSS2 from being visible due to reflection of an external light.

Figure 4A:
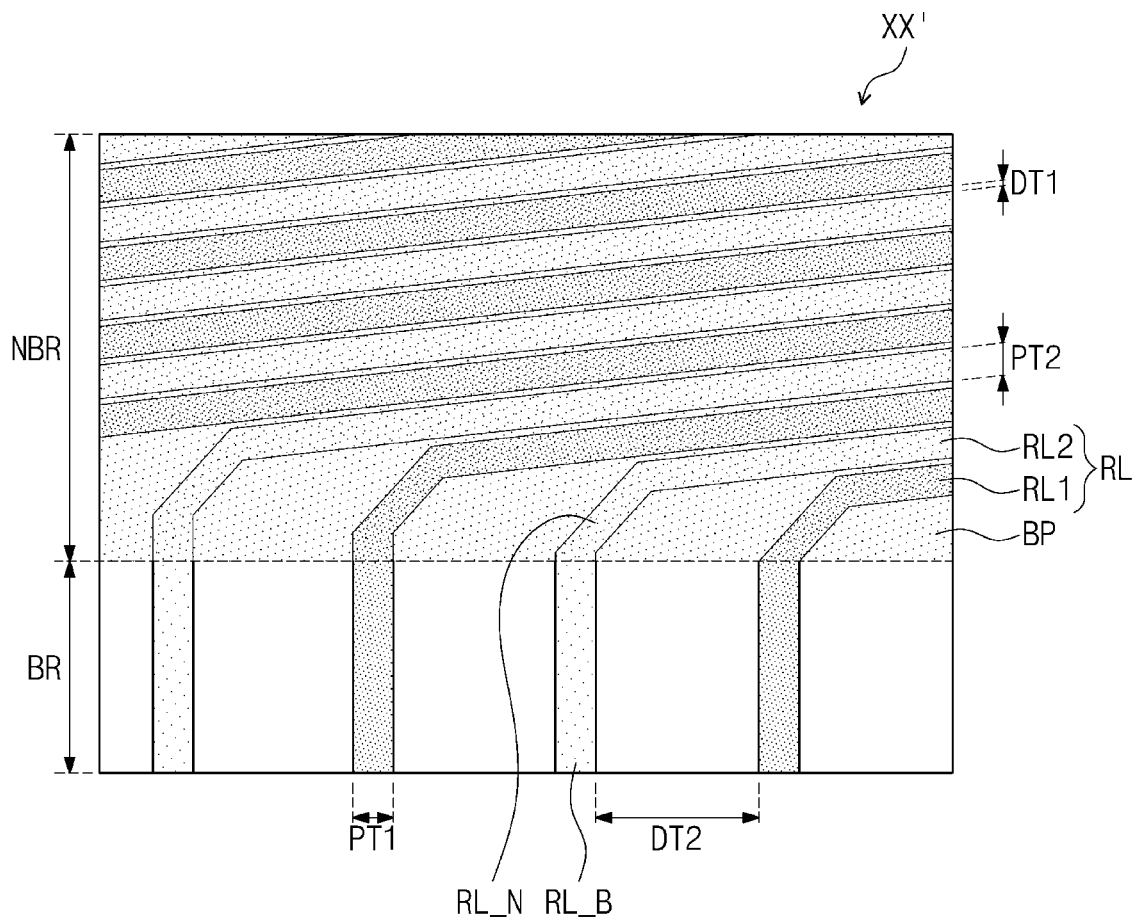
FIG. 4A is a plan view of a portion of an electronic panel according to an exemplary embodiment of the inventive concepts.
Figure 4B:
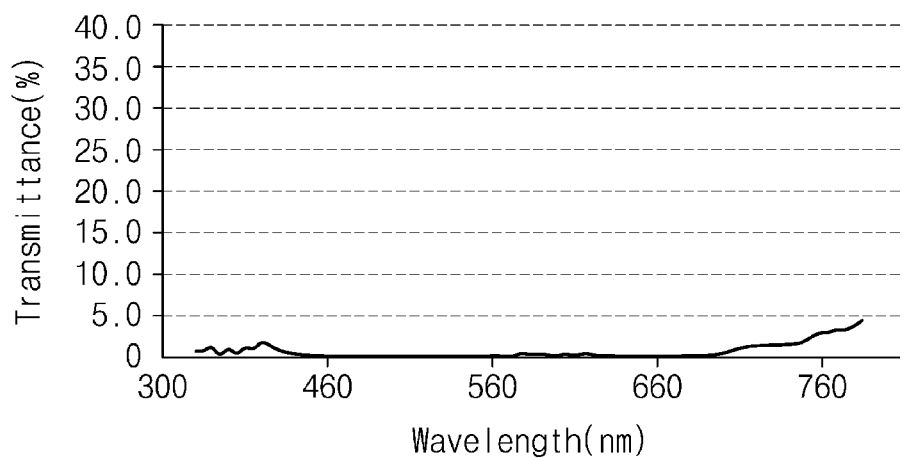
FIG. 4B is a graph showing transmittance of a peripheral portion for each wavelength, according to an exemplary embodiment of the inventive concepts.

FIG. 4A is a plan view of a portion of an electronic panel according to an exemplary embodiment of the inventive concepts. FIG. 4B is a graph showing transmittance of a peripheral portion for each wavelength, according to an exemplary embodiment of the inventive concepts. For easy description, area XX' illustrated in FIG. 2A is illustrated in FIG. 4A, and the peripheral portion BP is shaded. Transmittance of the peripheral portion BP illustrated in FIG. 4A is illustrated in FIG. 4B for each wavelength. Below, the inventive concepts will be described with reference to FIGS. 4A and 4B. Components that are the same as the components described with reference to FIGS. 1A to 3B are marked by the same reference numerals/symbols, and thus, additional description will be omitted to avoid redundancy.

As illustrated in FIG. 4A, fan-out lines RL are spaced from each other. The fan-out lines RL may include first fan-out lines RL1 and second fan-out lines RL2. The first fan-out lines RL1 and the second fan-out lines RL2 are differently shaded.

The first fan-out lines RL1 and the second fan-out lines RL2 are alternately disposed. The first fan-out lines RL1 and the second fan-out lines RL2 may be disposed on different layers. In this exemplary embodiment, a description will be given as the first fan-out lines RL1 are interposed between the second insulating layer 20 and the third insulating layer 30 and the second fan-out lines RL2 are disposed between the third insulating layer 30 and the fourth insulating layer 40.

Each of the first fan-out lines RL1 has a first width PT1, and each of the second fan-out lines RL2 has a second width PT2. The first width PT1 and the second width PT2 may be designed independently of each other.

The fan-out lines RL may be spaced from each other with a first distance DT1 in the non-bending portion NBR and may be spaced from each other with a second distance DT2 in the bending portion BR. In this exemplary embodiment, the first distance DT1 may be smaller than the second distance DT2. As such, the same number of fan-out lines RL may be disposed in the non-bending portion NBR to be dense within a small area, in comparison to the bending portion BR.

As described above, each of the first fan-out lines RL1 and the second fan-out lines RL2 may include the first portion RL_N and the second portion RL_B. The first portion RL_N is disposed in the non-bending portion NBR, and the second portion RL_B is disposed in the bending portion BR. In this exemplary embodiment, the first portion RL_N and the second portion RL_B are integrated with each other.

In this exemplary embodiment, the peripheral portion BP overlaps the first portion RL_N in a plan view. The first portion RL_N may be covered by the peripheral portion BP, and the second portion RL_B may be exposed from the peripheral portion BP.

Referring to FIG. 4B, the peripheral portion BP has light transmittance of 5% or less, within a wavelength range illustrated in FIG. 4B. In this exemplary embodiment, the peripheral portion BP may have a structure in which a red color pattern, a blue color pattern, and a green color pattern are stacked along a thickness direction of the electronic panel 200. In this exemplary embodiment, the peripheral portion BP may provide a function of substantially blocking a light corresponding to a visible light band.

As such, the second portion RL_B may not be visible from above the front surface when the electronic panel 200 (refer to FIG. 1A) is bent; the first portion RL_N is covered by the peripheral portion BP, thus reducing visibility. As such, a part, which is disposed in the non-bending portion NBR, of the fan-out lines RL may not be visible by the user, thus improving a display characteristic of the electronic panel 200.

Figure 5A:
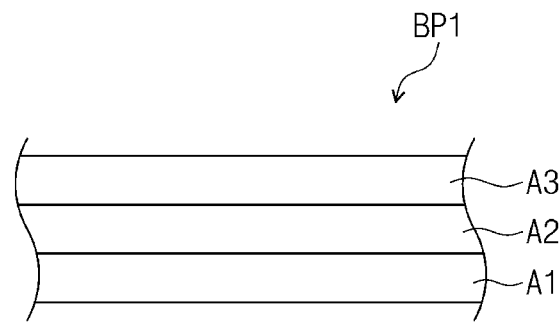
FIGS. 5A, 5B, and 5C are cross-sectional views of peripheral portions according to an exemplary embodiment of the inventive concepts.
Figure 5B:
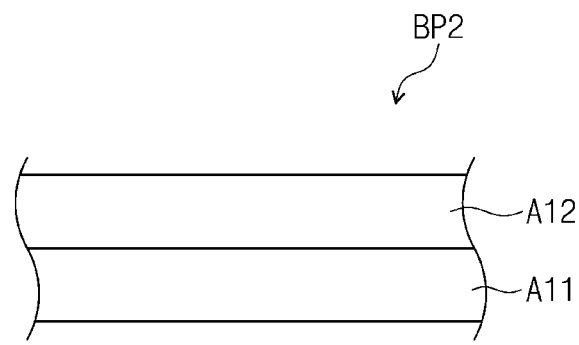
Figure 5C:
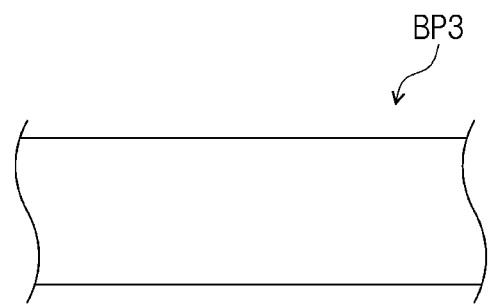

FIGS. 5A to 5C are cross-sectional views of peripheral portions according to an exemplary embodiment of the inventive concepts. FIGS. 6A to 6D are graphs showing transmittance of peripheral portions for each wavelength, according to an exemplary embodiment of the inventive concepts.

As illustrated in FIGS. 5A to 5C, peripheral portions BP1, BP2, and BP3 may have a stacked structure or a single-layer structure. For example, as illustrated in FIG. 5A, the peripheral portion BP1 may include three patterns A1, A2, and A3 stacked along a thickness direction. The first pattern A1, the second pattern A2, and the third pattern A3 may have different colors.

For example, the first pattern A1 may have a red color, the second pattern A2 may have a green color, and the third pattern A3 may have a blue color. The peripheral portion BP1 implemented with the first, second, and third patterns A1, A2, and A3 thus stacked may have a color corresponding to a combination of the red color, the green color, and the blue color.

Light transmittance of the peripheral portion BP1 may correspond to the graph illustrated in FIG. 4B. As the peripheral portion BP1 includes the first, second, and third patterns A1, A2, and A3 thus stacked, the peripheral portion BP1 may have a high light-blocking characteristic to a visible light.

Alternatively, as illustrated in FIG. 5B, the peripheral portion BP2 may include two patterns A11 and A12. The first pattern A11 and the second pattern A12 have different colors and are stacked along a thickness direction.

Figure 6A:
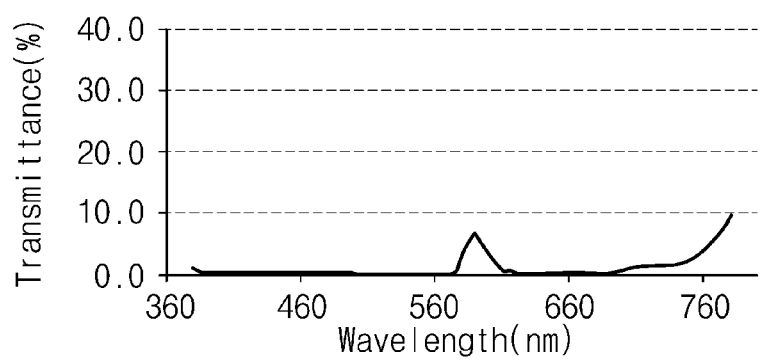
FIGS. 6A, 6B, 6C, and 6D are graphs showing transmittance of peripheral portions for each wavelength, according to an exemplary embodiment of the inventive concepts.
Figure 6B:
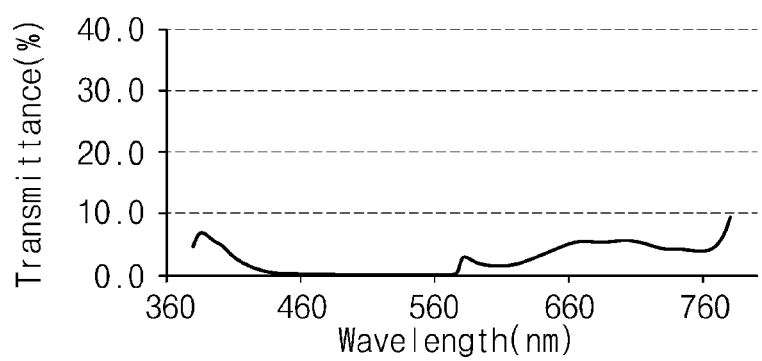
Figure 6C:
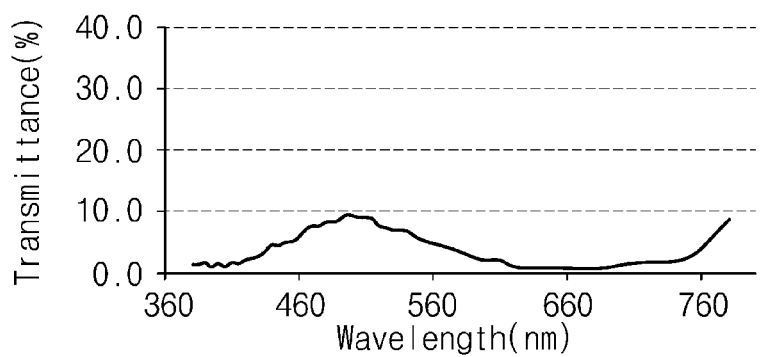

FIGS. 6A to 6C are graphs showing transmittance of the peripheral portion BP2 for each wavelength, according to an exemplary embodiment of the inventive concepts. In detail, a graph corresponding to an exemplary embodiment where the first pattern A11 has a red color and the second pattern A12 has a green color is illustrated in FIG. 6A. A graph corresponding to an exemplary embodiment where the first pattern A11 has a red color and the second pattern A12 has a blue color is illustrated in FIG. 6B. A graph corresponding to an exemplary embodiment where the first pattern A11 has a green color and the second pattern A12 has a blue color is illustrated in FIG. 6C.

Referring to FIGS. 6A to 6C, a deviation may exist for each wavelength band, but the peripheral portion BP2 has transmittance of about 10% or less across the whole visible light wavelength band. Accordingly, as the peripheral portion BP2 includes the stacked patterns A11 and A12, the peripheral portion BP2 may have a light-blocking characteristic to a visible light.

Alternatively, as illustrated in FIG. 5C, the peripheral portion BP3 may be implemented with a pattern having a single color. In this case, the peripheral portion BP3 may have a color of low brightness, substantially, a black color.

Figure 6D:
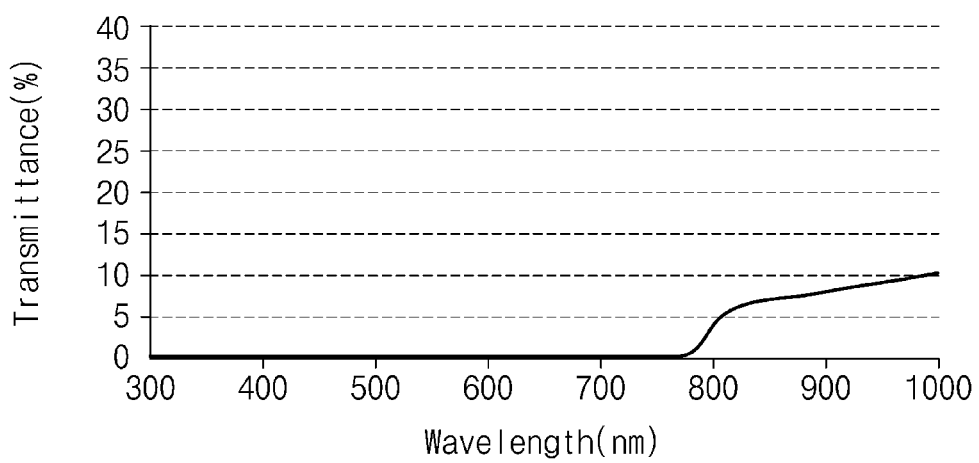

FIG. 6D is a graph associated with an exemplary embodiment where the peripheral portion BP3 has a black color. Referring to FIG. 6D, the peripheral portion BP3 has transmittance of substantially "0" with regard to a visible light wavelength band. Accordingly, even though the peripheral portion BP3 is implemented with a single pattern, the peripheral portion BP3 may have a color of low brightness and may thus have a light-blocking characteristic to a visible light.

According to the inventive concepts, the peripheral portions BP1, BP2, and BP3 may have various structures including a single-layer structure and a stacked structure, as long as the peripheral portions BP1, BP2, and BP3 have a light-blocking characteristic. The peripheral portions BP1, BP2, and BP3 may cover at least a portion of the peripheral area NAA (refer to FIG. 1A), thus preventing or reducing the issue that signal wires are visible due to reflection of an external light.

Figure 7A:
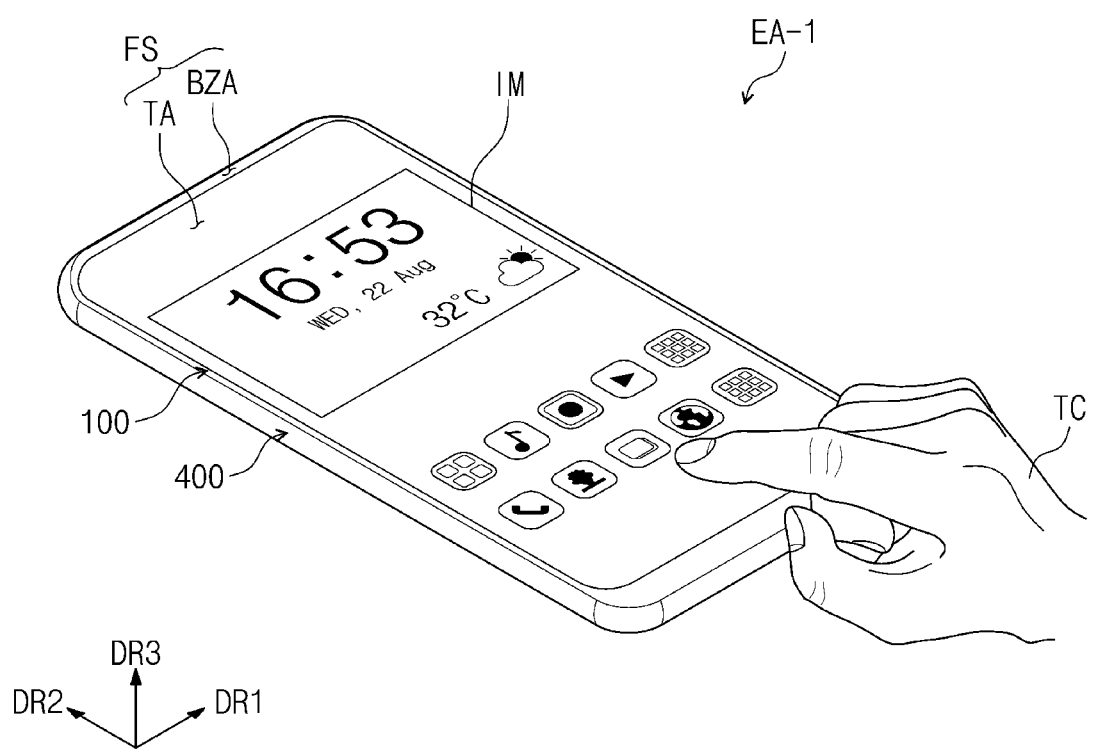
FIG. 7A is a perspective view of an electronic apparatus according to an exemplary embodiment of the inventive concepts.
Figure 7B:
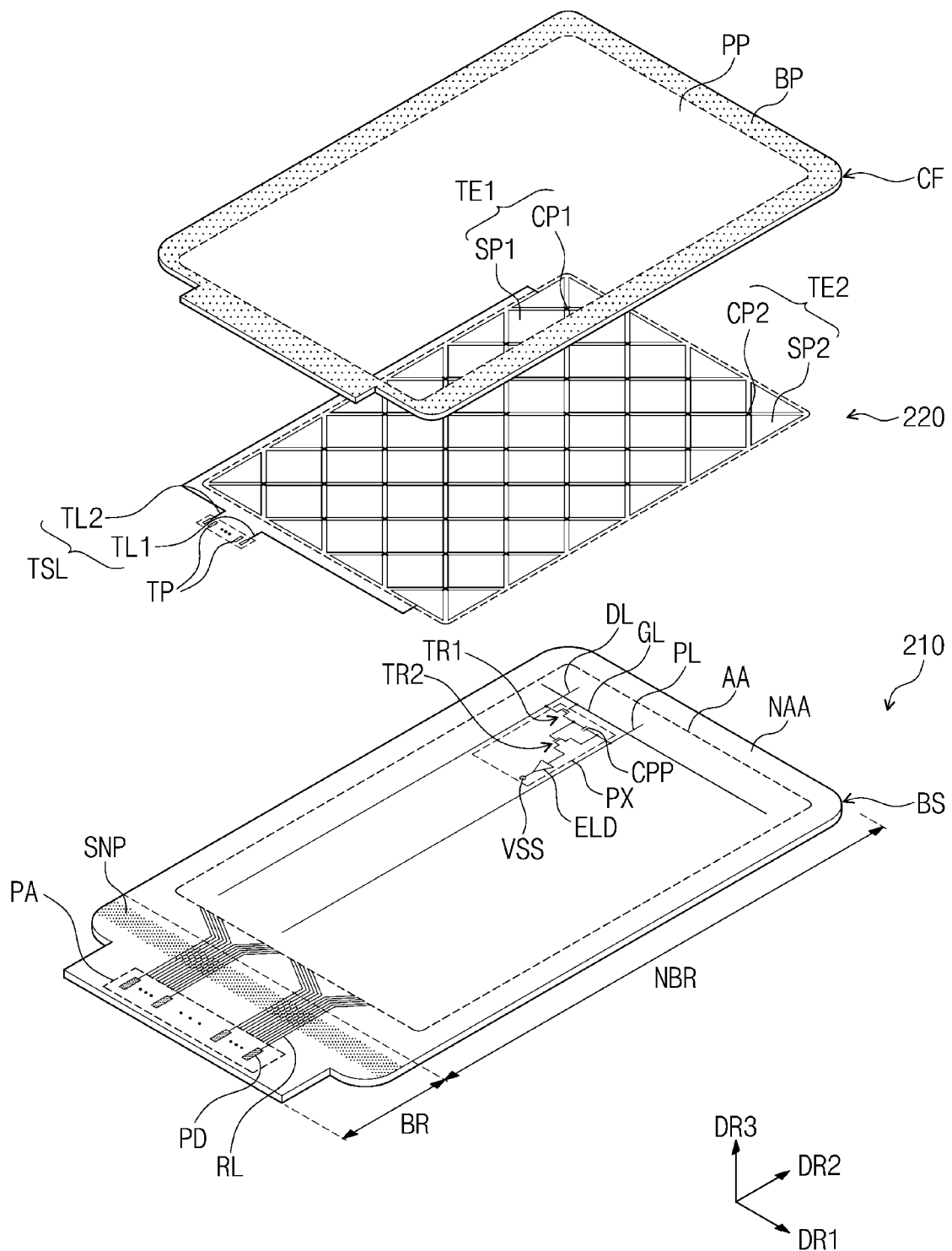
FIG. 7B is an exploded perspective view of an electronic apparatus of FIG. 7A.

FIG. 7A is a perspective view of an electronic apparatus according to an exemplary embodiment of the inventive concepts. FIG. 7B is an exploded perspective view of an electronic apparatus of FIG. 7A. Below, the inventive concepts will be described with reference to FIGS. 7A and 7B. Components that are the same as the components described with reference to FIGS. 1A to 6D are marked by the same reference numerals/symbols, and thus, additional description will be omitted to avoid redundancy.

As illustrated in FIG. 7A, an electronic apparatus EA-1 may display the image IM and may sense an input TC of the user applied from the outside. The image IM may correspond to that described with reference to the electronic apparatus EA (refer to FIG. 1A) of FIG. 1A, and thus, additional description will be omitted to avoid redundancy.

The user input TC includes various types of external inputs such as a portion of a body of the user, a light, heat, and pressure. Also, the electronic apparatus EA-1 may sense an approaching or adjacent input, as well as an input being in contact with the electronic apparatus EA-1.

In this exemplary embodiment, the user input TC is illustrated as user's hand that is on the front surface of the electronic apparatus EA-1 or approaches to the front surface thereof. However, the inventive concepts are not limited thereto. For example, as described above, the user input TC may be provided in various manners; the electronic apparatus EA-1 may sense the user input TC applied to a side surface or a back surface of the electronic apparatus EA-1 depending on a structure of the electronic apparatus EA-1, not limited to any one exemplary embodiment.

In this exemplary embodiment, the active area AA may be an area where the image IM is displayed and an external input TC is also sensed. However, the inventive concepts are not limited thereto. For example, in the active area AA, an area where the image IM is displayed and an area where the external input TC is sensed may be separated from each other, not limited to any one exemplary embodiment.

As illustrated in FIG. 7B, the electronic apparatus EA-1 may include the display unit 210, the input sensing unit 220, and the anti-reflection layer CF. For easy description, the window 100 and the outer case 400 are not illustrated in FIG. 7B.

The display unit 210 may correspond to the display unit 210 illustrated in FIG. 2A, and thus, additional description will be omitted to avoid redundancy.

The input sensing unit 220 is disposed on the display unit 210. The input sensing unit 220 may sense the external input TC and may obtain information about a position or intensity of the external input TC. The input sensing unit 220 may include a plurality of sensing electrodes TE1 and TE2, a plurality of sensing lines TL1 and TL2, and a plurality of sensing pads PD.

The sensing electrodes TE1 and TE2 are disposed in the active area AA. The sensing electrodes TE1 and TE2 may include the first sensing electrode TE1 and the second sensing electrode TE2 that receive different electrical signals. The input sensing unit 220 may obtain information about the external input TC through a change in a capacitance between the first sensing electrode TE1 and the second sensing electrode TE2.

The first sensing electrode TE1 may extend along the second direction DR2. The first sensing electrode TE1 may include a plurality of sensing electrodes that are spaced from each other along the first direction DR1. The first sensing electrode TE1 may include a plurality of first sensing patterns SP1 that are arranged along the second direction DR2 and are electrically connected to each other.

The second sensing electrode TE2 may extend along the first direction DR1. The second sensing electrode TE2 may include a plurality of sensing electrodes that are spaced from each other along the first direction DR1. The second sensing electrode TE2 may include a plurality of second sensing patterns SP2 that are arranged along the first direction DR1 and are electrically connected to each other.

Each of the sensing patterns SP1 and SP2 includes a conductive material. The sensing patterns SP1 and SP2 may be optically transparent. For example, the sensing patterns SP1 and SP2 may include transparent conductive oxide. Alternatively, each of the sensing patterns SP1 and SP2 includes a plurality of mesh lines.

The sensing lines TL1 and TL2 and terminal pads TP are disposed in the peripheral area NAA. The terminal pads TP are respectively connected to the sensing lines TL1 and TL2. In this exemplary embodiment, pads PD may include display pads connected to the pixels PX and sensing pads connected to the input sensing unit 220. The terminal pads TP are electrically connected to the sensing pads of the pads PD.

The sensing lines TL1 and TL2 include the first sensing line TL1 and the second sensing line TL2. The first sensing line SL1 connects a terminal pad corresponding to the first sensing electrode TE1 from among the terminal pads TP with the first sensing pattern SP1 and transfers an electrical signal provided from the outside from the sensing pad to the first sensing electrode TE1. The second sensing line TL2 connects a terminal pad corresponding to the second sensing electrode TE2 from among the terminal pads TP with the second sensing pattern SP2 and transfers an electrical signal provided from the outside from the sensing pad to the second sensing electrode TE2.

The anti-reflection layer CF is disposed on the input sensing unit 220. The active portion PP of the anti-reflection layer CF may overlap the active area AA and may cover the first sensing electrode TE1 and the second sensing electrode TE2. The peripheral portion BP of the anti-reflection layer CF may overlap at least a portion of the peripheral area NAA and may cover the non-bending portion NBR. A sensing line TSL and the terminal pads TP may be covered by the peripheral portion BP.

According to the inventive concepts, as the anti-reflection layer CF is further provided, the issue that the sensing line TSL, the terminal pads TP, and the fan-out lines RL are visible due to reflection of an external light may be easily prevented or reduced. This may mean that the display characteristic of the electronic apparatus EA-1 is improved.

Figure 8:
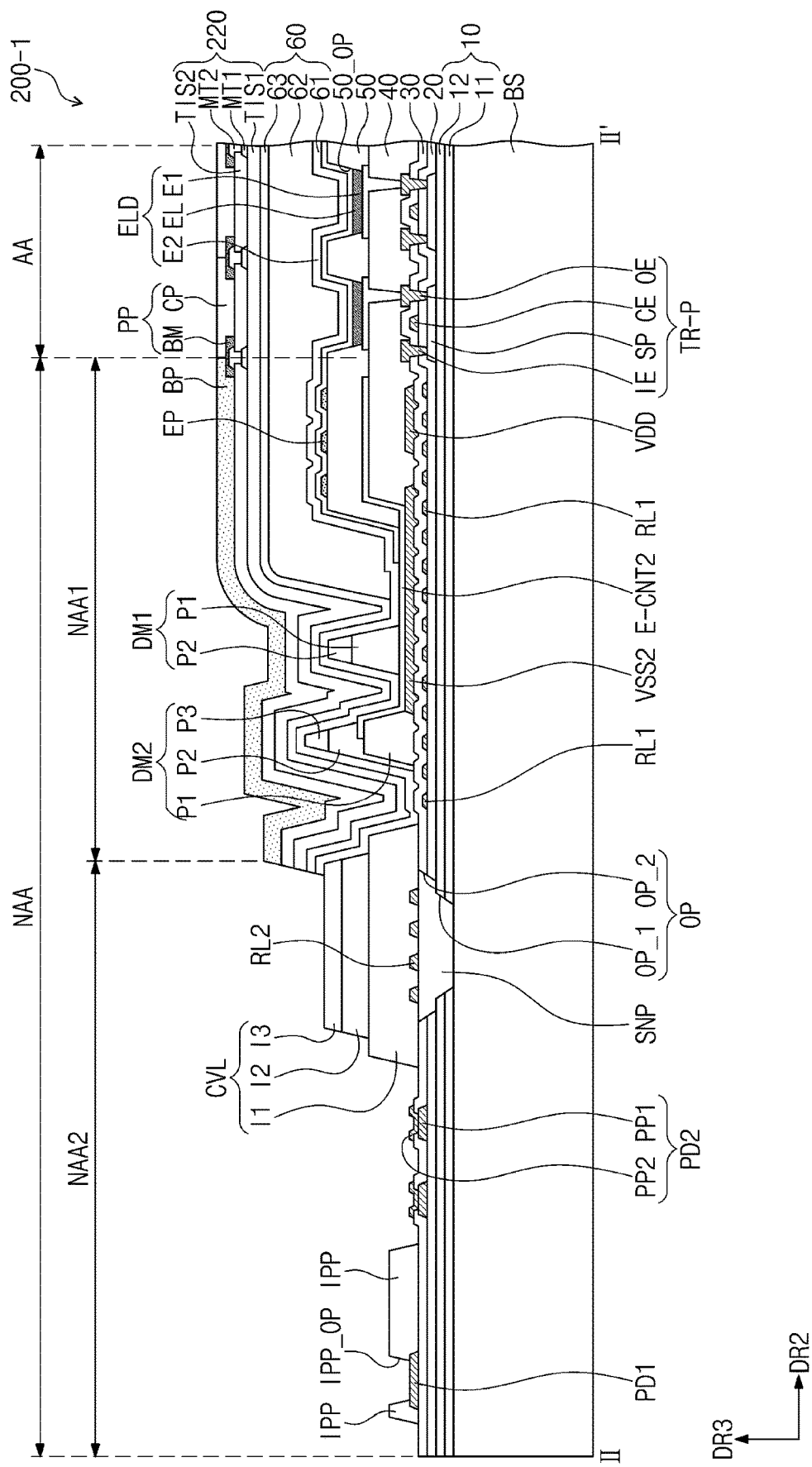
FIG. 8 is a cross-sectional view illustrating a portion of an electronic panel according to an exemplary embodiment of the inventive concepts.
Figure 9A:
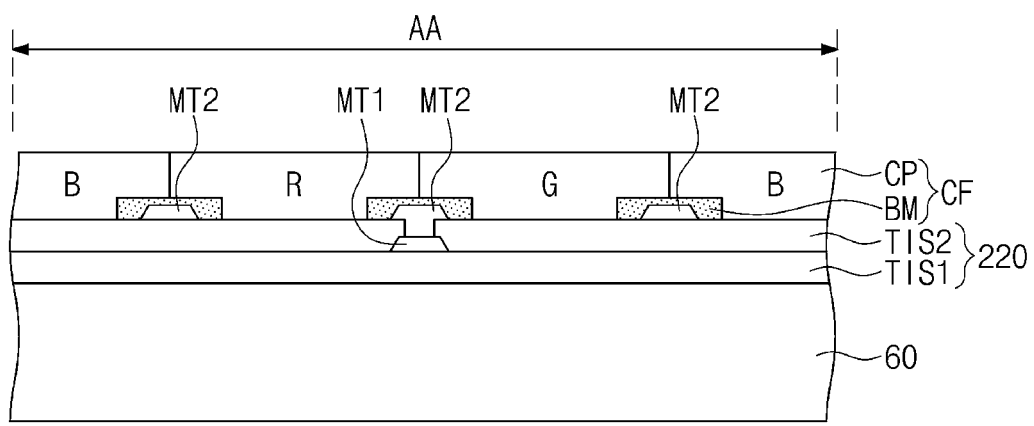
FIGS. 9A, 9B, and 9C are cross-sectional views illustrating a portion of an electronic panel according to an exemplary embodiment of the inventive concepts.
Figure 9B:
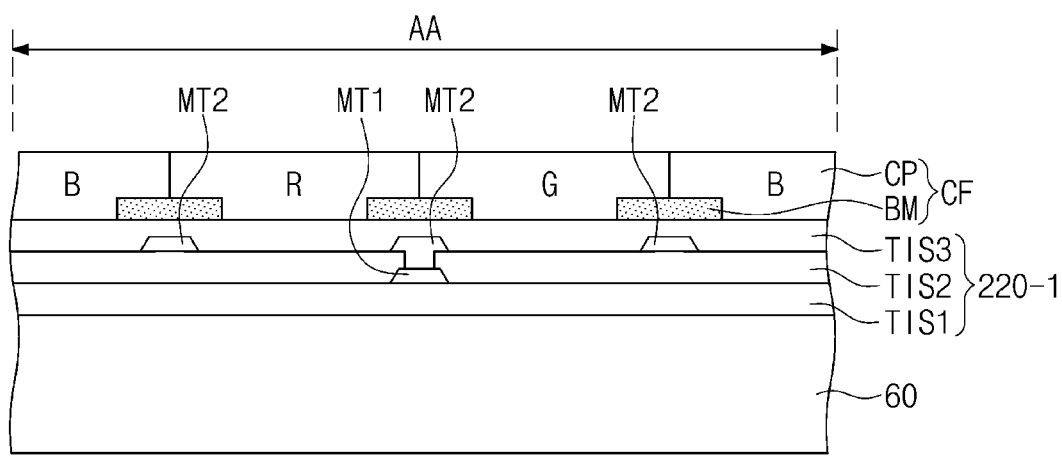
Figure 9C:
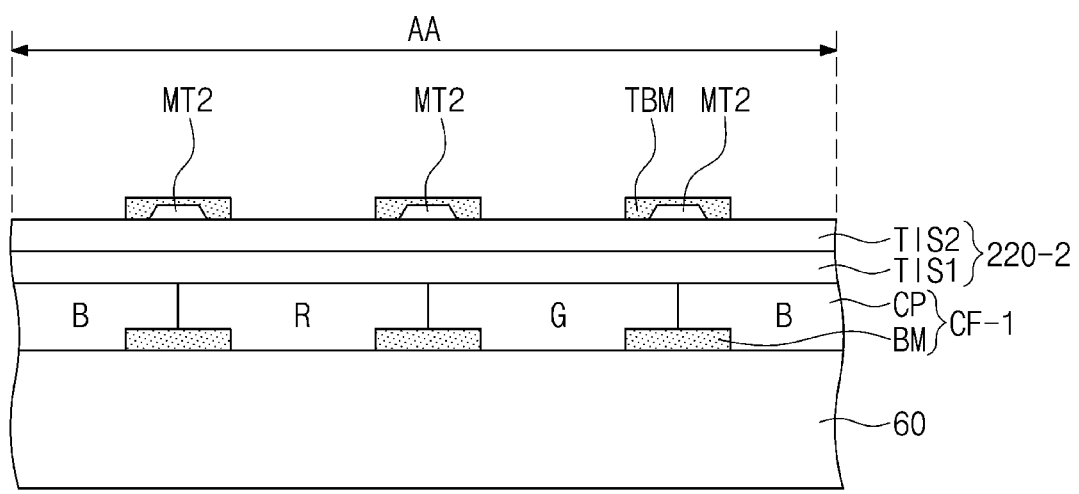

FIG. 8 is a cross-sectional view illustrating a portion of an electronic panel according to an exemplary embodiment of the inventive concepts. FIGS. 9A to 9C are cross-sectional views illustrating a portion of an electronic panel according to an exemplary embodiment of the inventive concepts. An area corresponding to FIG. 3B is illustrated in FIG. 8. Below, the inventive concepts will be described with reference to FIGS. 8 to 9C. Components that are the same as the components described with reference to FIGS. 1A to 7B are marked by the same reference numerals/symbols, and thus, additional description will be omitted to avoid redundancy.

As illustrated in FIG. 8, in an electronic panel 200-1, the input sensing unit 220 is interposed between the sixth insulating layer 60 and the anti-reflection layer CF. In this exemplary embodiment, the display unit 210 corresponds to the display unit illustrated in FIG. 3B, and thus, additional description will be omitted to avoid redundancy.

A first sensing insulating layer TIS1, a second sensing insulating layer TIS2, first patterns MT1, and second patterns MT2 of the input sensing unit 220 are illustrated in FIG. 8 as an example. The first patterns MT1 and the second patterns MT2 are disposed on different layers. The first patterns MT1 are interposed between the first sensing insulating layer TIS1 and the second sensing insulating layer TIS2, and the second patterns MT2 are disposed on the second sensing insulating layer TIS2. In this exemplary embodiment, a part of the second patterns MT2 are connected to the first patterns MT1.

The first patterns MT1 and the second patterns MT2 may constitute the first sensing electrode TE1 (refer to FIG. 7B) and the second sensing electrode TE2 (refer to FIG. 7B). For example, the first patterns MT1 may constitute a first connecting pattern CP1 (refer to FIG. 7B), and the second patterns MT2 may constitute the first and second sensing patterns SP1 and SP2 (refer to FIG. 7B) and a second connecting pattern CP2 (refer to FIG. 7B). Alternatively, the first patterns MT1 may constitute the first and second sensing patterns SP1 and SP2 and the first connecting pattern CP1, and the second patterns MT2 may constitute the second connecting pattern CP2.

Meanwhile, the first patterns MT1 may constitute the first sensing electrode TE1, and the second patterns MT2 may constitute the second sensing electrode TE2. In this case, the first patterns MT1 and the second patterns MT2 are not connected to each other. An electronic apparatus according to an exemplary embodiment of the inventive concepts may include the input sensing unit 220 having various structures, not limited to any one exemplary embodiment.

Each of the first sensing insulating layer TIS1 and the second sensing insulating layer TIS2 may include an insulating material. Each of the first sensing insulating layer TIS1 and the second sensing insulating layer TIS2 may include an organic material and/or an inorganic material. A part of the second patterns MT2 passes through the second sensing insulating layer TIS2 and is connected to the first patterns MT1.

At least any one of the first patterns MT1 and the second patterns MT2 may include a plurality of mesh lines. In this case, each of the first patterns MT1 or each of the second patterns MT2 may be one mesh line. Each of the first patterns MT1 and the second patterns MT2 may be disposed not to overlap the opening 50_OP. As such, the issue that the visibility of a light generated from the light-emitting element ELD decreases due to the input sensing unit 220 may be prevented or reduced.

However, the inventive concepts are not limited thereto. For example, a part of the first patterns MT1 and the second patterns MT2 may be disposed to overlap the opening 50_OP. Alternatively, at least a part of the first patterns MT1 and the second patterns MT2 may be optically transparent. The input sensing unit 220 according to an exemplary embodiment of the inventive concepts may be provided in various structures and shapes, not limited to any one exemplary embodiment.

As illustrated in FIGS. 8 and 9A, in the electronic panel 200-1, the anti-reflection layer CF may be disposed on the input sensing unit 220. The black matrix BM may cover the second patterns MT2. The second patterns MT2 may be covered by the black matrix BM, and thus, the second patterns MT2 may not be visible from the outside. As such, the issue that the first and second electrodes TE1 and TE2 are visible due to reflection of an external light may be easily prevented or reduced.

Alternatively, as illustrated in FIG. 9B, an input sensing unit 220-1 may further include a third sensing insulating layer TIS3. The third sensing insulating layer TIS3 may be interposed between the second sensing insulating layer TIS2 and the anti-reflection layer CF. The third sensing insulating layer TIS3 may prevent a direct contact between the anti-reflection layer CF and the second patterns MT2. As such, the issue that the second patterns MT2 are damaged by the anti-reflection layer CF may be easily prevented or reduced.

Alternatively, as illustrated in FIG. 9C, an anti-reflection layer CF-1 may be disposed under the input sensing unit 220-2. The anti-reflection layer CF-1 is illustrated as being interposed between the input sensing unit 220-2 and the sixth insulating layer (encapsulation layer) 60. In this case, an electronic apparatus may further include a plurality of light-blocking patterns TBM disposed on the input sensing unit 220-2. The light-blocking patterns TBM cover the second patterns MT2, respectively.

As illustrated in FIGS. 8 to 9C, the anti-reflection layer CF or CF-1 may be disposed under or over the input sensing unit 220, 220-1, or 220-2; of course, the display unit 210 may easily solve the issue due to reflection of an external light of the input sensing unit 220, 220-1, or 220-2. Also, the anti-reflection layer CF may be expanded to the peripheral area NAA as well as the active area AA, thus making it possible to easily solve the issue due to reflection of an external light by various signal lines disposed in the peripheral area NAA. As such, the visibility of the electronic panel 200-1 may be easily solved.

According to the inventive concepts, as signal lines disposed in a peripheral area are covered by an anti-reflection layer, a light blocking characteristic of an area where signal lines are disposed may be improved. As such, the issue that signal lines are visible due to incidence of an external light may be prevented or reduced, and a display characteristic of an electronic panel may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. An electronic apparatus comprising:
a base substrate including an active area and a peripheral area adjacent to the active area;
a plurality of pixels disposed in the active area;
a plurality of pads disposed in the peripheral area;
fan-out lines disposed in the peripheral area and connecting the plurality of pixels and the plurality of pads; and
an anti-reflection layer including an active portion and a peripheral portion, wherein the active portion overlaps the active area and comprises a plurality of color patterns respectively overlapping the plurality of pixels, and the peripheral portion overlaps the peripheral area, and wherein the anti-reflection layer overlaps at least a part of the fan-out lines.

2. The electronic apparatus of claim 1, wherein the base substrate comprises a non-bending portion including the active area, and a bending portion bent from the non-bending portion around a bending axis, and wherein each of the fan-out lines comprises a first portion disposed in the non-bending portion and a second portion disposed in the bending portion.

3. The electronic apparatus of claim 2, wherein the first portion overlaps the peripheral portion.

4. The electronic apparatus of claim 1, wherein the plurality of color patterns are arranged not to overlap each other.

5. The electronic apparatus of claim 4, wherein the active portion further comprises a black matrix interposed between the plurality of color patterns.

6. The electronic apparatus of claim 4, wherein two of the plurality of color patterns that are adjacent to each other have different colors.

7. The electronic apparatus of claim 1, wherein the peripheral portion has a single color.

8. The electronic apparatus of claim 7, wherein the peripheral portion has substantially black color.

9. The electronic apparatus of claim 7, wherein the peripheral portion comprises a plurality of patterns that have different colors and are stacked.

10. The electronic apparatus of claim 1, wherein each of the fan-out lines comprises:

a first portion extending in a diagonal direction with respect to a direction in which the plurality of pads are arranged; and a second portion extending in a perpendicular direction with respect to the direction in which the plurality of pads are arranged, wherein the peripheral portion overlaps the first portion.

11. The electronic apparatus of claim 1, wherein a light transmittance of the peripheral portion is about 10% or less.

12. The electronic apparatus of claim 1, further comprising:

an encapsulation layer disposed on the plurality of pixels and overlapping the active area and the peripheral area, wherein the anti-reflection layer is directly disposed on the encapsulation layer.

13. The electronic apparatus of claim 1, further comprising:

an input sensing unit disposed on the plurality of pixels to sense an external input, wherein the input sensing unit comprises:

a plurality of sensing patterns disposed in the active area; and a plurality of sensing lines disposed in the peripheral area and connected to the plurality of sensing patterns.

14. The electronic apparatus of claim 13, wherein the anti-reflection layer is interposed between the input sensing unit and the plurality of pixels.

15. The electronic apparatus of claim 14, wherein the input sensing unit further includes a light blocking pattern covering the sensing patterns, wherein each of the plurality of sensing patterns comprises a plurality of mesh lines, and wherein the light blocking pattern is disposed along the plurality of mesh lines.

16. The electronic apparatus of claim 13, wherein the anti-reflection layer is disposed on the input sensing unit.

17. An electronic apparatus comprising:

a display unit including a plurality of pixels disposed in an active area, a plurality of signal lines connected to the plurality of pixels, pads disposed in a pad area, and fan-out lines connecting the plurality of signal lines and the pads; and an anti-reflection layer disposed on the display unit, and including an active portion including a plurality of color patterns arranged adjacent to each other and a peripheral portion having a single color, wherein the anti-reflection layer overlaps at least a part of the fan-out lines.

18. The electronic apparatus of claim 17, wherein each of the fan-out lines comprises:

a first portion extending in a diagonal direction with respect to a direction in which the pads are arranged; and a second portion extending in a perpendicular direction with respect to the direction in which the pads are arranged, wherein the peripheral portion overlaps the first portion.

19. The electronic apparatus of claim 17, further comprising:

an input sensing unit disposed on the display unit and including a plurality of sensing patterns and a plurality of sensing lines connected with the plurality of sensing patterns, wherein the anti-reflection layer is interposed between the input sensing unit and the display unit.

20. The electronic apparatus of claim 17, wherein a light transmittance of the peripheral portion is about 10% or less.

* * * * *